(12) United States Patent
Sakata

(10) Patent No.: US 8,809,928 B2
(45) Date of Patent: Aug. 19, 2014

(54) SEMICONDUCTOR DEVICE, MEMORY DEVICE, AND METHOD FOR MANUFACTURING THE SEMICONDUCTOR DEVICE

(75) Inventor: Junichiro Sakata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 20 days.

(21) Appl. No.: 13/455,476

(22) Filed: Apr. 25, 2012

(65) Prior Publication Data

US 2012/0280225 A1 Nov. 8, 2012

(30) Foreign Application Priority Data

May 6, 2011 (JP) ................. 2011-103766

(51) Int. Cl.
*H01L 27/108* (2006.01)
*H01L 29/94* (2006.01)
*H01L 27/12* (2006.01)

(52) U.S. Cl.
USPC ............................ 257/296; 257/289; 257/350

(58) Field of Classification Search
USPC .......................................... 257/296, 289, 350
See application file for complete search history.

(56) References Cited

U.S. PATENT DOCUMENTS

| | | | |
|---|---|---|---|
| 4,466,081 A | 8/1984 | Masuoka | |
| 5,528,032 A | 6/1996 | Uchiyama | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fukumoto.E et al., "High Mobility Oxide Semiconductor TFT for Circuit Integration of AM-OLED," IDW '10: Proceedings of the 16th International Display Workshops, Dec. 1, 2010, pp. 631-634.

(Continued)

*Primary Examiner* — Ngan Ngo
(74) *Attorney, Agent, or Firm* — Eric J. Robinson; Robinson Intellectual Property Law Office, P.C.

(57) ABSTRACT

An oxide semiconductor is used for a semiconductor layer of a transistor included in a semiconductor device, whereby leakage current between a source and a drain can be reduced, so that reduction in power consumption of a semiconductor device and a memory device including the semiconductor device and an improvement in characteristics of retaining stored data (electric charge) in the semiconductor device and the memory device can be achieved. Further, a drain electrode of the transistor, the semiconductor layer, and a first electrode which overlaps with the drain electrode form a capacitor, and a gate electrode is led to an overlying layer at a position which overlaps with the capacitor. Thus, the semiconductor device and the memory device including the semiconductor device can be miniaturized.

16 Claims, 11 Drawing Sheets

(56) References Cited

U.S. PATENT DOCUMENTS

| | | | |
|---|---|---|---|
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,863,611 B2 * | 1/2011 | Abe et al. | 257/58 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 * | 3/2007 | Yabuta | 257/347 |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0032668 A1 * | 2/2010 | Yamazaki et al. | 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0178224 A1 * | 7/2012 | Yamazaki | 438/151 |
| 2013/0146869 A1 * | 6/2013 | Sakata | 257/43 |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

(56) References Cited

OTHER PUBLICATIONS

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=in,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 626-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Backplane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

(56) References Cited

OTHER PUBLICATIONS

Kimizuka.N. et al., "Spinel,YbFe2O4, and Yb2Fe3O7 Types of Structures for Compounds in the IN2O3 and Sc2O3—A2O3—BO Systems [A; Fe, Ga, or Al; B: Mg, Mn, Fe, Ni, Cu,or Zn] At Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1982, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4304-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

SEMICONDUCTOR DEVICE, MEMORY DEVICE, AND METHOD FOR MANUFACTURING THE SEMICONDUCTOR DEVICE

BACKGROUND OF THE INVENTION

1. Field of the Invention

The present invention relates to a semiconductor device, a memory device, and a method for manufacturing the semiconductor device.

2. Description of the Related Art

Semiconductor devices using semiconductor elements, for example, memory devices are broadly classified into two categories: a volatile memory device that loses stored data when supply of power stops, and a non-volatile memory device that retains stored data even when supply of power stops. In terms of data retention and low power consumption, non-volatile memory devices have attracted attention.

A typical example of a non-volatile memory device is a flash memory. A flash memory includes a floating gate between a gate electrode and a channel formation region in a transistor and stores data by retaining electric charge in the floating gate. Therefore, a flash memory has advantages in that the data retention time is extremely long (almost permanent) and refresh operation which is necessary in a volatile memory device is not needed (e.g., see Patent Document 1).

However, a gate insulating layer included in a transistor is deteriorated by tunneling current generated in writing; therefore, there is a problem in that the gate insulating layer is deteriorated by repetition of a writing operation and an erasing operation and the memory element stops its function. In order to reduce adverse effects of the problem, a method in which the number of write cycles in the memory elements is the same is employed, for example. However, in order to carry this method, a complicated peripheral circuit is needed, and the problem of lifetime is not solved fundamentally. In other words, a flash memory is not suitable for applications in which data is frequently rewritten.

A typical example of a volatile memory device is a dynamic random access memory (DRAM). A memory element of a DRAM includes a read and write transistor and a capacitor, and a gate insulating layer is not deteriorated by writing operation and reading operation. However, there is a problem in that since information is stored as electric charge in the capacitor, leakage current is generated between a source and a drain even when the transistor is in an off state; thus electric charge flows into or out of the capacitor even when the transistor is not selected, so that the data retention time is short. For that reason, another writing operation (refresh operation) is necessary at predetermined intervals, and it is difficult to sufficiently reduce power consumption.

Another example of a volatile memory device is an SRAM (static random access memory). An SRAM is characterized in that it retains stored data by using a circuit such as a flip-flop and thus does not need refresh operation, but poses a problem in that an area occupied by such a memory device in a semiconductor device is large. Moreover, as in a DRAM, stored data in an SRAM is lost when supply of power stops.

REFERENCE

Patent Document

[Patent Document 1] Japanese Published Patent Application No. S57-105889

SUMMARY OF THE INVENTION

As described above, a transistor used for a nonvolatile memory such as a flash memory has excellent characteristics of retaining stored data because it has a floating gate, but poses problems in that high power consumption is needed for rewriting of stored data and there is a limitation on the number of write cycles because a gate electrode is deteriorated in rewriting. On the other hand, in a transistor used for a volatile memory such as a DRAM, there is no limitation on the number of write cycles; however, it is difficult to retain stored data (electric charge) in a capacitor, and refresh operation needs to be conducted at regular intervals in order to retain stored data.

In addition, memory devices are required to be more highly integrated.

An object of one embodiment of the present invention is to provide a semiconductor device in which the number of write cycles is not limited, power consumption is low, and characteristics of retaining stored data (electric charge) are improved, and which is suitable for miniaturization. Another object of one embodiment of the present invention is to provide a memory device with low power consumption which includes the semiconductor device and is highly integrated.

In the present invention, a transistor includes a semiconductor layer formed using an oxide semiconductor material which can sufficiently reduce off-state current of a transistor. By using an oxide semiconductor material, leakage current between a source and a drain caused when the transistor is in an off state (a state in which the voltage applied to a gate electrode is lower than or equal to the threshold voltage) can be made extremely low, so that power consumption can be reduced.

Further, in the present invention, a first electrode is provided at a position which overlaps with a source electrode (or a drain electrode) with an oxide semiconductor layer interposed therebetween. Furthermore, in the present invention, a gate electrode has a structure in which it is extended toward the first electrode so as to overlap with the first electrode, and in addition, the gate electrode is connected to a wiring provided over an interlayer insulating layer at a position which overlaps with the first electrode.

In the above-described structure, with the use of the source electrode (or the drain electrode) and the oxide semiconductor layer which are part of the components included in the transistor, and the first electrode, the capacitor can be provide at a position which overlaps with the transistor, and in addition, the gate electrode can be connected to the wiring provided over the interlayer insulating layer at a position which overlaps with the first electrode (i.e., a position which overlaps with the capacitor). Thus, manufacturing time and manufacturing cost of the semiconductor device can be reduced, and the semiconductor device can be highly integrated.

Further, since the leakage current of a semiconductor layer formed using an oxide semiconductor material is extremely small, in a memory device having a structure in which a source electrode (or a drain electrode) of a transistor and a capacitor are connected to each other, stored data (electric charge) in the capacitor can be retained for a long time, so that characteristics of retaining stored data (electric charge) can be improved.

In other words, one embodiment of the present invention is a semiconductor device including a source electrode and a drain electrode over an insulating surface; an oxide semiconductor layer over the insulating surface, the source electrode, and the drain electrode; a first electrode which overlaps with one of the source electrode and the drain electrode and is provided over the oxide semiconductor layer; a gate insulating layer which covers the oxide semiconductor layer and the first electrode; a gate electrode over the insulating layer so as to overlap with the first electrode; and an interlayer insulating layer provided over the gate insulating layer and the gate electrode. Further, at least part of the gate electrode which overlaps with the first electrode is exposed through a contact hole provided in the interlayer insulating layer.

Another embodiment of the present invention is a semiconductor device in which the first electrode is connected to a fixed potential such as a ground potential or a common potential in the above-described structure.

In the structure, the first electrode is set to a constant potential (preferably, a ground potential), whereby even when the potential of the gate electrode is changed, the potential applied to the capacitor is not changed, so that stable electric charge can be accumulated in the capacitor.

Another embodiment of the present invention is a semiconductor device in which the oxide semiconductor layer contains one or more elements selected from In, Ga, Sn, and Zn in the above-described structure.

Another embodiment of the present invention is a memory device including the semiconductor device having any of the above structures.

Another embodiment of the present invention is a method for manufacturing a semiconductor device including steps of forming a source electrode and a drain electrode over an insulating surface; forming an oxide semiconductor layer over the insulating surface, the source electrode, and the drain electrode; forming a first electrode which is provided over the oxide semiconductor layer and overlaps with one of the source electrode and the drain electrode; forming a gate insulating layer which covers the oxide semiconductor layer and the first electrode; forming a gate electrode over the gate insulating layer so as to overlap with the first electrode, and is provided over the gate insulating layer; forming an interlayer insulating layer over the gate insulating layer and the gate electrode; performing a planarization treatment on the interlayer insulating layer so that at least part of the gate electrode is exposed on a surface of the interlayer insulating layer.

In this specification and the like, the expression "substantially perpendicular" does not require exact perpendicular, and the expression "substantially parallel" does not require exact parallel.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Furthermore, in this specification and the like, functions of a "source" and a "drain" may sometimes be switched when transistors of different polarities are employed or when the direction of current flowing is changed in circuit operation, for example. Therefore, the terms "source" and "drain" can be used to denote the drain and the source, respectively, in this specification.

In addition in this specification and the like, an ordinal number such as "first" or "second" is given for convenience to distinguish elements, and is not given to limit the number, arrangement, and the order of steps. Further, in this specification, steps in which films, layers, materials, substrates, and the like are formed over two substrates are described; therefore, different reference numerals are used for the same films, layers, materials, and substrates in some cases.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

A transistor includes a semiconductor layer formed using an oxide semiconductor material, whereby leakage current between a source and a drain can be extremely reduced, which leads to a reduction in power consumption.

Further, the first electrode is provided in a position which overlaps with the source electrode (or the drain electrode) with the oxide semiconductor layer interposed therebetween, and the gate electrode is provided over the gate insulating layer so as to overlap with the first electrode. The first electrode is connected to a fixed potential such as a ground potential or a common potential. Thus, the capacitor can be provided at a position which overlaps with the transistor, and in addition, the gate electrode can be connected to the wiring provided over the interlayer insulating layer at a position which overlaps with the capacitor, so that the semiconductor device can be highly integrated. In a memory device using the semiconductor device as at least its part, lower power consumption and miniaturization can be achieved.

Further, since the leakage current of a semiconductor layer formed using an oxide semiconductor material is extremely low, in a memory device having a structure in which a source electrode (or a drain electrode) of a transistor and a capacitor are connected to each other, stored data (electric charge) in the capacitor can be retained for a long time, so that characteristics of retaining stored data (electric charge) can be improved.

DETAILED DESCRIPTION OF THE INVENTION

Figure 1A:
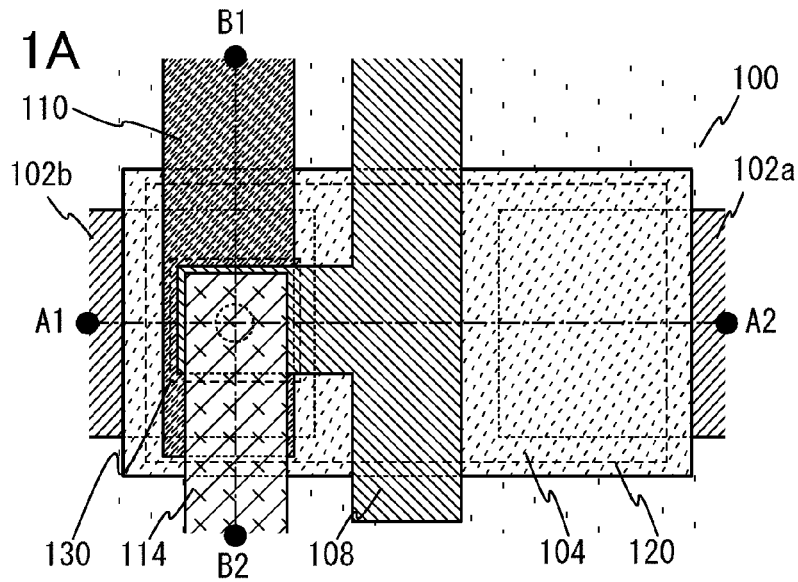
FIGS. 1A to 1C are views illustrating a structure of a semiconductor device described in Embodiment 1.

Hereinafter, embodiments of the disclosed invention are described with reference to the drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

Embodiment 1

In this embodiment, a structure of a semiconductor device according to one embodiment of the present invention will be described with reference to FIGS. 1A to 1C, and a method for manufacturing the semiconductor device will be described with reference to FIGS. 2A to 2D and FIGS. 3A and 3B.
<Example of Structure of Semiconductor Device>

Figure 1B:
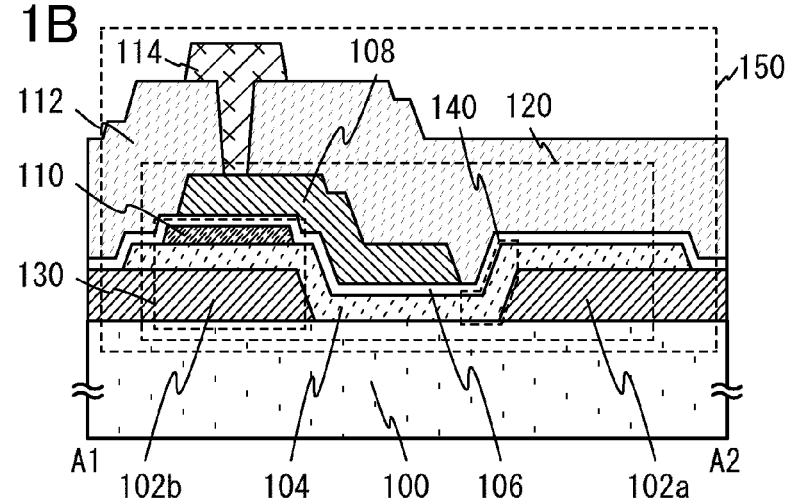
Figure 1C:
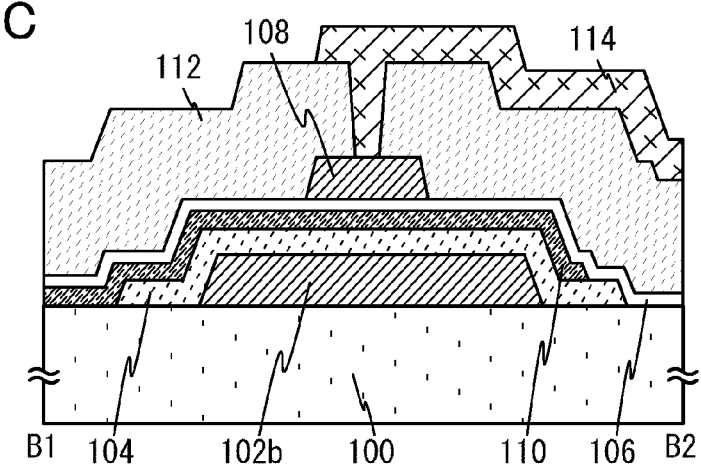

FIGS. 1A to 1C illustrate an example of a structure of a semiconductor device 150 manufactured by a method described in this embodiment. FIG. 1A is a top view of the semiconductor device 150, FIG. 1B is a cross-sectional view taken along dashed-dotted line A1-A2 of FIG. 1A, and FIG. 1C is a cross-sectional view taken along dashed-dotted line B1-B2 of FIG. 1A. Note that in the top view of FIG. 1A, a gate insulating layer 106 and an interlayer insulating layer 112 are omitted for easy understanding of the structure.

The semiconductor device 150 illustrated in FIGS. 1A to 1C includes a transistor 120 and a capacitor 130. The transistor 120 includes a source electrode 102a and a drain electrode 102b provided over a substrate 100 having an insulating surface; an oxide semiconductor layer 104 provided over the substrate 100, the source electrode 102a, and the drain electrode 102b; a first electrode 110 which overlaps with the drain electrode 102b and the oxide semiconductor layer 104 and is provided over the oxide semiconductor layer 104; a gate insulating layer 106 which covers the oxide semiconductor layer 104 and the first electrode 110; a gate electrode 108 which overlaps with a gap between the source electrode 102a and the drain electrode 102b, is extended toward the first electrode 110 so as to overlap with the first electrode 110, and is provided over the gate insulating layer 106; an interlayer insulating layer 112 which covers the gate insulating layer 106 and the gate electrode 108 and is provided over the gate electrode 108; and a wiring 114 which is electrically connected to the gate electrode 108, and is provided over the gate electrode 108 and the interlayer insulating layer 112. Further, the semiconductor device 150 has the capacitor 130 including the drain electrode 102b (serving as a lower electrode of the capacitor), the first electrode 110 (serving as an upper electrode of the capacitor), and the oxide semiconductor layer 104 (serving as an insulating layer between the upper electrode and the lower electrode). Note that a portion of the oxide semiconductor layer 104 which is interposed between the source electrode 102a and the drain electrode 102b serves as a channel formation region. Further, the first electrode 110 (serving as a lower electrode), the gate insulating layer 106 (serving as a dielectric film), and the gate electrode 108 (serving as an upper electrode) forms a capacitor (hereinafter also referred to as "a second capacitor").

In this embodiment, the wiring 114 is described as a component different from the gate electrode 108; however, the wiring 114 can be regarded as part of the gate electrode 108 because it is electrically connected to the gate electrode 108.

The transistor 120 and the capacitor 130 share some components; thus the semiconductor device can be manufactured efficiently through a small number of steps, which leads to a reduction in manufacturing time and manufacturing cost of the semiconductor device. Further, since the capacitor 130 can be provided so as to overlap with part of the transistor 120, the semiconductor device 150 can be highly integrated.

As illustrated in FIG. 1B, in the case where a film used as a dielectric film of the capacitor 130 and a film used for a semiconductor layer of the transistor 120 are formed as a continuous semiconductor layer using the same material, a general semiconductor layer such as a silicon film does not serve as a capacitor because electric charge flows in a lateral direction (e.g., a portion of a silicon film formed in the gap between the source electrode 102a and the drain electrode 102b) even when attempt to accumulate electric charge in the capacitor 130 is made. On the other hand, as described in this embodiment and the like, the i-type (intrinsic) or substantially i-type oxide semiconductor layer 104 is used, whereby leakage current of the transistor 120 is extremely small in the case where voltage applied to the gate electrode 108 is lower than or equal to the threshold voltage of the transistor 120; thus the amount of reduction in electric charge of the capacitor 130 is extremely small. Accordingly, electric charge can be retained in the capacitor 130 for a long time.

Figure 4A:
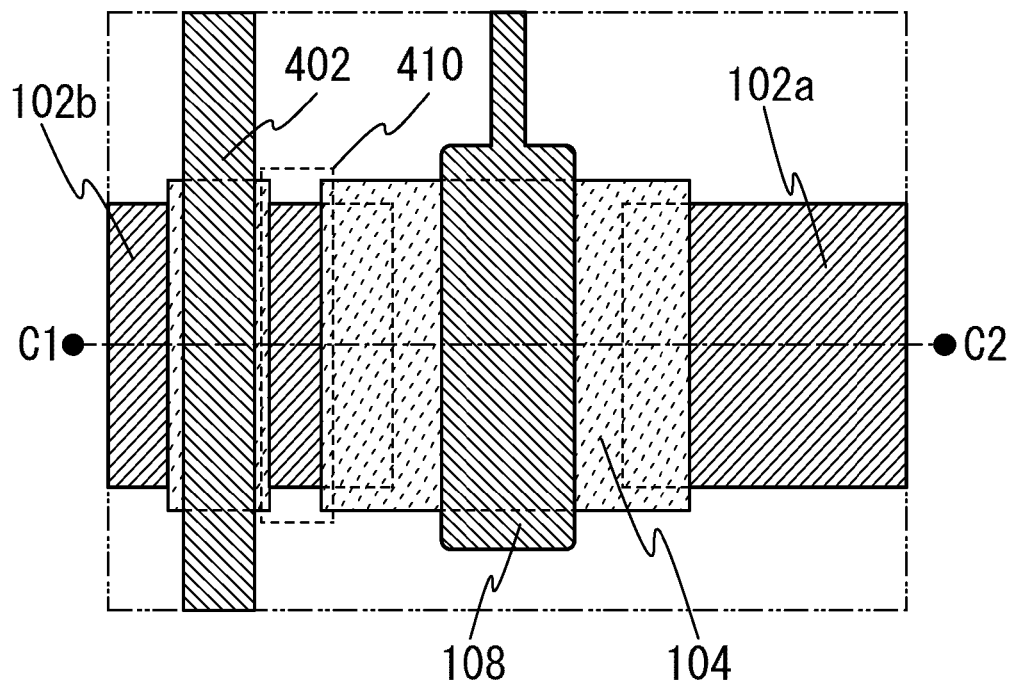
FIGS. 4A and 4B are views illustrating a structure of a semiconductor device, which are used for explanation comparison with the semiconductor device of Embodiment 1.
Figure 4B:
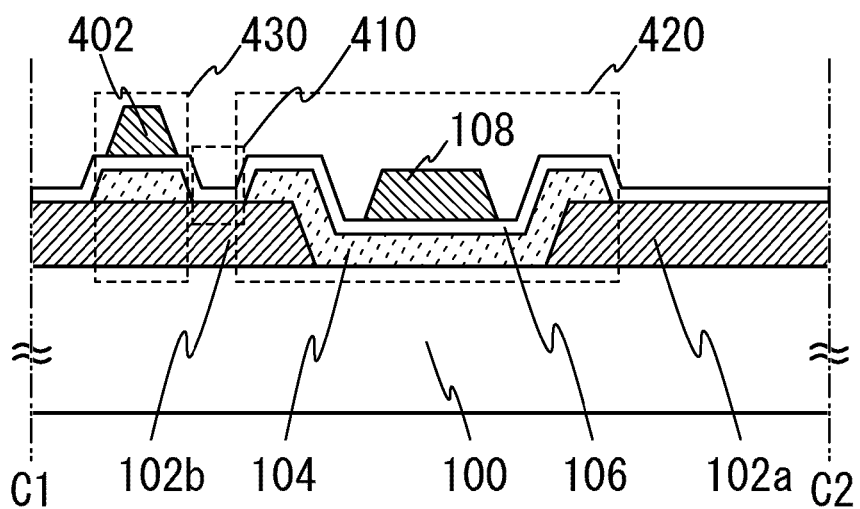

In the case where a transistor and a capacitor are separately formed, as illustrated in FIGS. 4A and 4B for example, it is necessary to form a groove portion 410 which separates a transistor 420 and a capacitor 430 between the transistor 420 and the capacitor 430 (having a structure in which the oxide semiconductor layer 104 and the gate insulating layer 106 are interposed between the drain electrode 102b and a conductive layer 402). In forming the groove portion 410, distance between the transistor 420 and the capacitor 430 needs to be designed to prevent a phenomenon in which misalignment occurs due to a device in light-exposure treatment of a resist or in which the groove portion 410 spreads beyond a designed value in etching treatment, which may cause decrease in the degree of integration of the semiconductor device. On the other hand, in the semiconductor device 150 of this embodiment having a structure in which the transistor 120 and the capacitor 130 are formed in an integrated manner, it is not necessary to form the groove portion 410 and to consider a phenomenon in which misalignment occurs due to a device in light-exposure treatment of a resist, in which the groove portion 410 spreads in etching treatment, or the like. Accordingly, the semiconductor device 150 of this embodiment having a structure in which the transistor 120 and the capacitor 130 overlap at least partially with each other can have smaller area than the semiconductor device in which the transistor and the capacitor are separately provided, which can contribute to high integration of the semiconductor device.

Further, as illustrated in FIG. 1B, the semiconductor device 150 preferably has a structure in which the source electrode 102a and the gate electrode 108 do not overlap with each other. In a region where the source electrode 102a and the gate electrode 108 do not overlap with each other (corresponding to a region 140 illustrated in FIG. 1B), a channel formation region in the oxide semiconductor layer is less likely to be formed than in a region where the drain electrode 102b and the gate electrode 108 overlaps with each other; therefore, leakage current between the source electrode 102a and the drain electrode 102b can be further reduced.

Note that another capacitor may be provided in addition to the capacitor 130 which is formed in an integrated manner with the transistor 120.

Here, the oxide semiconductor layer 104 used for the semiconductor device 150 is preferably a semiconductor film which is highly purified by sufficiently removing an impurity such as hydrogen therefrom and sufficiently supplying oxygen thereto. Specifically, the hydrogen concentration in the oxide semiconductor layer 104 is lower than or equal to $5 \times 10^{19}$ atoms/cm$^3$, preferably lower than or equal to $5 \times 10^{18}$ atoms/cm$^3$, further preferably lower than or equal to $5 \times 10^{17}$ atoms/cm$^3$, for example. Note that the hydrogen concentration in the oxide semiconductor layer 104 is measured by secondary ion mass spectrometry (SIMS). A carrier concentration which is less than $1 \times 10^{12}$/cm$^3$, preferably less than $1 \times 10^{11}$/cm$^3$, and more preferably less than $1 \times 10^{10}$/cm$^3$ is obtained in the oxide semiconductor layer 104 in which the hydrogen concentration is sufficiently reduced in such a manner and defect levels in an energy gap caused by oxygen vacancy are reduced by sufficient supply of oxygen. When such an oxide semiconductor layer 104 is used, for example, the off-state current (per unit channel width (1 μm), here) of the transistor 120 in the semiconductor device 150 at room temperature (25° C.) is less than or equal to 100 zA (1 zA (zeptoampere) is $1 \times 10^{-21}$ A), preferably less than or equal to 10 zA. In this manner, by using the i-type (intrinsic) or substantially i-type oxide semiconductor layer 104, the transistor 120 with extremely low off-state current can be obtained.

In addition, the sodium concentration in the oxide semiconductor layer 104 is lower than or equal to $5 \times 10^{16}$ atoms/cm$^3$, preferably lower than or equal to $1 \times 10^{16}$ atoms/cm$^3$, further preferably lower than or equal to $1 \times 10^{15}$ atoms/cm$^3$. Further, the lithium concentration in the oxide semiconductor layer 104 is lower than or equal to $5 \times 10^{15}$ atoms/cm$^3$, preferably lower than or equal to $1 \times 10^{15}$ atoms/cm$^3$. The potassium concentration in the oxide semiconductor layer 104 is lower than or equal to $5 \times 10^{15}$ atoms/cm$^3$, preferably lower than or equal to $1 \times 10^{15}$ atoms/cm$^3$. The sodium concentration, the lithium concentration, and the potassium concentration in the oxide semiconductor layer 104 are measured by secondary ion mass spectrometry. An alkali metal and an alkaline earth metal are adverse impurities for an oxide semiconductor and are preferably contained as little as possible. An alkali metal, in particular, sodium diffuses into an oxide and becomes Na$^+$ when an insulating film in contact with the oxide semiconductor is an oxide. In addition, sodium breaks a bond between metal and oxygen or enters the bond in the oxide semiconductor. As a result, transistor characteristics deteriorate (e.g., the transistor becomes normally-on (the shift of a threshold voltage of the transistor to a negative side) or the mobility is decreased). In addition, this also causes variation in the characteristics. Such a problem is significant especially in the case where the hydrogen concentration in the oxide semiconductor is extremely low. Thus, the concentration of an alkali metal is strongly required to be the above value in the case where the hydrogen concentration in the oxide semiconductor is lower than or equal to $5 \times 10^{19}$ atoms/cm$^3$, particularly lower than or equal to $5 \times 10^{18}$ atoms/cm$^3$.

The oxide semiconductor layer 104 is in a single crystal state, a polycrystalline (also referred to as polycrystal) state, an amorphous state, or the like.

The oxide semiconductor layer 104 is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase (In this specification, the CAAC-OS film is referred to as "oxide semiconductor layer", which is synonymous with "CAAC-OS film"). Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

<Method for Manufacturing Semiconductor Device>

A method for manufacturing the semiconductor device 150 described in this embodiment will be described below with reference to FIGS. 2A to 2D, FIGS. 3A and 3B, and FIGS. 4A and 4B.

Figure 2A:
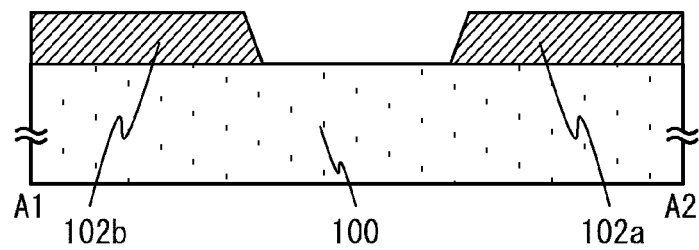
FIGS. 2A to 2D are views illustrating a method for manufacturing the semiconductor device described in Embodiment 1.

First, a substrate 100 is prepared, and the source electrode 102a and the drain electrode 102b are formed over the substrate 100 (see FIG. 2A).

As the substrate 100, for example, a glass substrate (e.g., a barium borosilicate glass substrate and an aluminoborosilicate glass substrate), a substrate formed of an insulator (e.g., a ceramic substrate, a quartz substrate, and a sapphire substrate), a crystallized glass substrate, a plastic substrate, a semiconductor substrate (e.g., a silicon substrate), or the like can be used.

The source electrode 102a and the drain electrode 102b may be formed in such a manner that first, a conductive layer is formed over the substrate 100 by a PVD method such as a resistance heating evaporation method or a sputtering method, a resist for obtaining a desired pattern shape is formed over the conductive layer by a known technique such as a photolithography method or an ink-jet method, and an unnecessary portion of the conductive layer is selectively removed using a known technique such as a dry etching method or a wet etching method. Note that an element selected from aluminum, chromium, copper, tantalum, titanium, molybdenum, tungsten, manganese, magnesium, zirconium, beryllium, neodymium, and scandium, an alloy containing any of the above-described elements as its main component, or the like can be used for a material of the conductive layer.

Note that the conductive layer may have a single-layer structure or a stacked-layer structure including two or more layers. For example, the following structures can be employed: a single-layer structure of a titanium film or a titanium nitride film; a two-layer structure in which a titanium film is stacked over an aluminum film; a two-layer structure in which a titanium film is stacked over a titanium nitride film; a three-layer structure in which an aluminum film is interposed between titanium films; a three-layer structure in which an aluminum film is interposed between molybdenum films; and the like.

Alternatively, the conductive layer may be formed using conductive metal oxide. As the conductive metal oxide, indium oxide ($In_2O_3$), tin oxide ($SnO_2$), zinc oxide (ZnO), an indium oxide-tin oxide ($In_2O_3$—$SnO_2$, which is abbreviated to ITO in some cases), an indium oxide-zinc oxide ($In_2O_3$—ZnO), or any of these metal oxide materials in which silicon or silicon oxide is included can be used.

In general, a conductive metal oxide has a higher resistance value than a metal film but has a light-transmitting property; therefore, the source electrode 102a and the drain electrode 102b are formed using a metal oxide film, and the gate electrode 108 which is to be formed in a later step is formed using a metal oxide film, whereby the semiconductor device 150 manufactured in this embodiment or the like can have a light-transmitting property. When a semiconductor device is manufactured using such a semiconductor element having a light-transmitting property, the semiconductor device can have a light-transmitting property.

Note that a film from which oxygen is released by heat treatment (hereinafter referred to as "oxygen supply film") is preferably formed over the substrate 100 having an insulating surface. The reason is described below.

When oxygen vacancy exists in a channel formation region of the transistor 120, electric charge is generated due to oxygen vacancy in some cases. In general, part of oxygen vacancy in the oxide semiconductor layer 104 serves as a donor and causes release of an electron which is a carrier. As a result, the threshold voltage of a transistor shifts in the negative direction. Accordingly, an oxygen supply film is preferably formed over the substrate 100 having an insulating surface.

When an oxygen supply film exists over the substrate 100 having an insulating surface, after the oxide semiconductor layer 104 to be described later is formed, part of oxygen in the oxygen supply film can be released by heat treatment; therefore, the oxygen can be supplied to the oxide semiconductor layer and oxygen vacancy in the oxide semiconductor layer can be filled, which can suppress the shift of the threshold voltage of the transistor in the negative direction. In particular, the oxygen supply film preferably contains oxygen which exceeds at least the stoichiometric composition ratio. For example, in the case where silicon oxide is used for the oxygen supply film, a film of silicon oxide represented by $SiO_{2+\alpha}$ ($\alpha$>0) is preferably used. Note that a region containing a larger amount of oxygen than the stoichiometric composition ratio (hereinafter referred to as "an oxygen-excessive region" in some cases) may exist in at least part of the oxygen supply film.

Note that "a film from which oxygen is released by heat treatment" described above refers to a film whose amount of released oxygen when converted into oxygen atoms in thermal desorption spectroscopy (TDS) is greater than or equal to $1.0\times10^{19}$ atoms/cm$^3$, preferably greater than or equal to $3.0\times10^{19}$ atoms/cm$^3$, further preferably greater than or equal to $1.0\times10^{20}$ atoms/cm$^3$, still further preferably greater than or equal to $3.0\times10^{20}$ atoms/cm$^3$.

Here, a method in which the amount of released oxygen is measured by being converted into oxygen atoms using TDS analysis will now be described.

The amount of released gas in TDS analysis is proportional to a time integral value of ion intensity. Therefore, the amount of released gas can be calculated from the ratio between the time integral value of the measured ion intensity and the reference value of a standard sample. The reference value of a standard sample refers to the ratio of the density of a predetermined atom contained in a sample to the time integral value of the ion intensity.

For example, the number of released oxygen molecules ($N_{O2}$) from an insulating film can be found according to Formula 1 with the TDS analysis results of a silicon wafer containing hydrogen at a predetermined density which is the standard sample and the TDS analysis results of the insulating film. Here, all spectra having a mass-to-charge ratio (M/z) of 32 which are obtained by the TDS analysis are assumed to originate from an oxygen molecule. $CH_3OH$, which is given as a gas where M/z=32, is not taken into consideration on the assumption that it is unlikely to be present. Further, an oxygen molecule including an oxygen atom where M/z=17 or 18 which is an isotope of an oxygen atom is not taken into consideration either because the proportion of such a molecule in the natural world is minimal.

$$N_{O2} = \frac{N_{H2}}{S_{H2}} \times S_{O2} \times a \qquad (1)$$

$N_{H2}$ is the value obtained by conversion of the number of hydrogen molecules desorbed from the standard sample into densities. $S_{H2}$ is the time integral value of the ion intensity when the standard sample is subjected to the TDS analysis. Here, the reference value of the standard sample is set to $N_{H2}/S_{H2}$. $S_{O2}$ is the time integral value of the ion intensity when the insulating film is subjected to TDS analysis. $\alpha$ is a coefficient which influences spectrum intensity in TDS analysis. Refer to Japanese Published Patent Application No. H6-275697 for details of Formula 1. Note that the amount of released oxygen from the above insulating film is measured with a thermal desorption spectroscopy apparatus produced by ESCO Ltd., EMD-WA1000S/W using a silicon wafer containing hydrogen atoms at $1\times10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above a includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

For the introduction of oxygen into the oxide semiconductor layer, heat treatment performed under an oxygen atmosphere, an ion implantation method, an ion doping method, a plasma immersion ion implantation method, plasma treatment performed under an atmosphere containing oxygen, or the like can be employed.

Further, in the case where the hydrogen concentration in an insulating film containing excess oxygen (hereinafter also referred to as "oxygen supply film") is greater than or equal to $7.2\times10^{20}$ atoms/cm$^3$, variation in initial characteristics of the transistor is increased, a channel length dependence of electric characteristics of the transistor is increased, and the transistor is significantly deteriorated in the BT stress test; therefore, the hydrogen concentration in the oxygen supply film is preferably less than $7.2\times10^{20}$ atoms/cm$^3$. In other words, the hydrogen concentration in the oxide semiconductor layer is preferably less than or equal to $5\times10^{19}$ atoms/cm$^3$, and the hydrogen concentration in the oxygen supply film is preferably less than $7.2\times10^{20}$ atoms/cm$^3$. A method for forming a film having a low hydrogen concentration will be described in detail later.

Note that in the case where oxygen is supplied from the oxygen supply film to the oxide semiconductor layer by heat treatment, it is preferable that a film having a low oxygen or water vapor permeability (also referred to as a low moisture permeability), which is also referred to as a barrier film in some cases hereinafter, be formed under the oxygen supply film so that oxygen released from the oxygen supply film can be supplied to the oxide semiconductor layer efficiently. For example, under the oxygen supply film, an aluminum oxide film, an aluminum oxynitride film, an aluminum nitride oxide film, or the like may be formed as a barrier film. In the case of using an aluminum oxide film, the aluminum oxide film preferably has a high density (film density of higher than or equal to 3.2 g/cm$^3$, preferably higher than or equal to 3.6 g/cm$^3$).

Figure 2B:
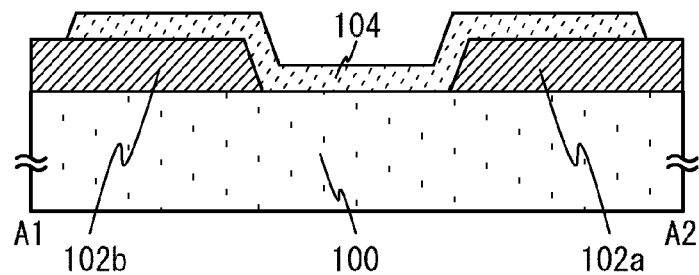
Figure 2C:
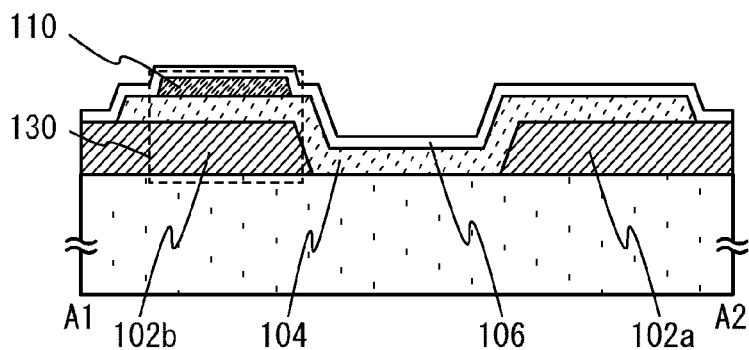
Figure 2D:
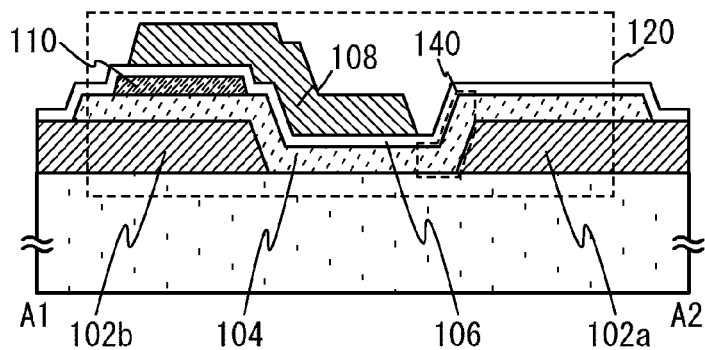

Next, the oxide semiconductor layer 104 is formed over the substrate 100, the source electrode 102a, and the drain electrode 102b (see FIG. 2B).

The oxide semiconductor layer 104 may be formed in such a manner that an oxide semiconductor film is formed by a sputtering method, a molecular beam epitaxy (MBE) method, a CVD method, a pulse laser deposition method, an atomic layer deposition (ALD) method, or the like, a resist for obtaining a desired pattern shape is formed by a known technique such as a photolithography method or an ink-jet method, and an unnecessary portion of the oxide semiconductor film is selectively removed using a known technique such as a dry etching method or a wet etching method. The oxide semiconductor film may be formed using a sputtering apparatus which performs deposition with surfaces of a plurality of substrates set substantially perpendicular to a surface of a sputtering target, which is a so-called columnar plasma (CP) sputtering system. Note that the thickness of the oxide semiconductor film is greater than 5 nm and less than or equal to 200 nm, preferably greater than or equal to 10 nm and less than or equal to 30 nm.

In order to reduce oxygen vacancy in the oxide semiconductor layer 104 as much as possible, it is preferable that the oxide semiconductor film used for formation of the oxide semiconductor layer 104 be deposited with a deposition atmosphere in which an oxygen gas accounts for a large proportion; therefore, it can be said that it is preferable to use a sputtering apparatus into which oxygen can be introduced and in which the gas flow rate can be adjusted. Further, 90% or more of the gas introduced into a deposition chamber of the sputtering apparatus is an oxygen gas, and in the case where another gas is used in addition to the oxygen gas, a rare gas is preferably used. Further, it is more preferable that the gas introduced into the deposition chamber be only an oxygen gas and the percentage of an oxygen gas in the deposition atmosphere be as closer to 100% as possible.

Further, when the oxide semiconductor layer 104 contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Accordingly, the hydrogen concentration in the oxide semiconductor layer 104 is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, further more preferably lower than or equal to $1\times10^{16}$ atoms/cm$^3$. Note that the above hydrogen concentration in the oxide semiconductor layer is measured by secondary ion mass spectrometry (SIMS).

For the above-described reason, it is preferable that the gas used for deposition of the oxide semiconductor film does not contain an impurity such as water, hydrogen, a hydroxyl group, or hydride. Further, it is preferable to use a gas having a purity greater than or equal to 6N, preferably greater than or equal to 7N (i.e., the impurity concentration in the gas is less than or equal to 1 ppm, preferably less than or equal to 0.1 ppm).

Further, in deposition of the oxide semiconductor film, in order to remove moisture (including water, water vapor, hydrogen, a hydroxyl group, or hydroxide) in the deposition chamber, an entrapment vacuum pump such as a cryopump, an ion pump, or a titanium sublimation pump is preferably used. The evacuation unit may be a turbo molecular pump provided with a cold trap. From the deposition chamber which is evacuated with a cryopump, a hydrogen atom, a compound containing a hydrogen atom such as water ($H_2O$) (more preferably, also a compound containing a carbon atom), and the like are removed, whereby the concentration of an impurity such as hydrogen or moisture in the oxide semiconductor layer 104 formed in the deposition chamber can be reduced.

On the other hand, when the oxide semiconductor layer 104 contains an alkali metal or an alkaline earth metal, the alkali metal or the alkaline earth metal and an oxide semiconductor are bonded to each other, so that carriers are generated in some cases, which causes an increase in the off-state current of a transistor. Accordingly, the concentration of an alkali metal or an alkaline earth metal in the oxide semiconductor layer 104 is lower than or equal to $1\times10^{18}$ atoms/cm$^3$, preferably lower than or equal to $2\times10^{16}$ atoms/cm$^3$.

Note that a target used in the sputtering apparatus preferably has a relative density of greater than or equal to 90%, preferably greater than or equal to 95%. With the use of a target having a high relative density, an oxide semiconductor film used for formation of the oxide semiconductor layer 104 can be made dense.

An oxide semiconductor material used for the oxide semiconductor layer 104 contains at least indium (In). In particular, In and zinc (Zn) are preferably contained. In addition, as a stabilizer for reducing the variation in electric characteristics of a transistor using the oxide, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn—O-based oxide" means an oxide containing In, Ga, and Zn as its main component and there is no particular limitation on the ratio of In: Ga: Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by $In_2SnO_5(ZnO)_n$ (n>0, n is an integer) may be used.

The deposited oxide semiconductor film is in a single crystal state, a polycrystalline (also referred to as polycrystal) state, an amorphous state, or the like.

The oxide semiconductor film is preferably a CAAC-OS (c-axis aligned crystalline oxide semiconductor) film. Refer to the above description for the explanation of the CAAC-OS film.

In an oxide semiconductor having a crystal part as the CAAC-OS film, defects in the bulk can be further reduced and when the surface planarity of the oxide semiconductor is improved, mobility higher than that of an oxide semiconductor in an amorphous state can be obtained. In order to improve the surface planarity, the oxide semiconductor is preferably formed over a planar surface. Specifically, the oxide semiconductor may be formed over a surface with the average surface roughness (Ra) of less than or equal to 1 nm, preferably less than or equal to 0.3 nm, more preferably less than or equal to 0.1 nm Therefore, planarization treatment is preferably performed on a surface over which the oxide semiconductor is to be formed. As the planarization treatment, chemical mechanical polishing (CMP) treatment, a dry etching method, or the like may be used. Note that the CMP treatment may be performed only once or plural times. When the CMP treatment is performed plural times, first polishing is preferably performed with a high polishing rate followed by final polishing with a low polishing rate. By performing polishing steps with different polishing rates in combination, the planarity of the surface over which the oxide semiconductor is to be formed can be further improved.

Note that, $R_a$ is obtained by three-dimension expansion of center line average roughness that is defined by JIS B 0601 so as to be applied to a plane. The $R_a$ can be expressed as an "average value of the absolute values of deviations from a reference surface to a specific surface" and is defined by the formula below.

$$R_a = \frac{1}{S_0} \int_{y1}^{y2} \int_{x1}^{x2} |f(x, y) - Z_0| dx dy \qquad (2)$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

As described above, the surface over which the oxide semiconductor film is to be formed is planarized, whereby crystals in the oxide semiconductor film are likely to grow in a direction substantially perpendicular to the surface over which the oxide semiconductor film is to be formed.

Figure 8A:
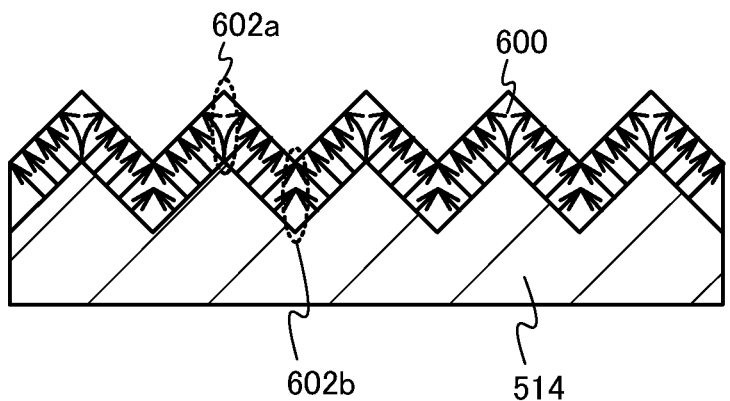
FIGS. 8A to 8C are views each illustrating a crystal growth in an oxide semiconductor layer.
Figure 8B:
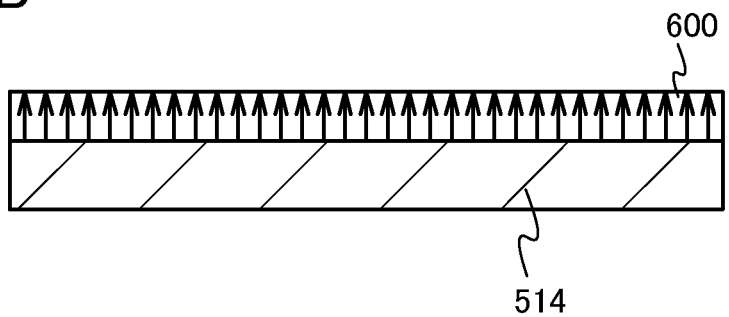
Figure 8C:
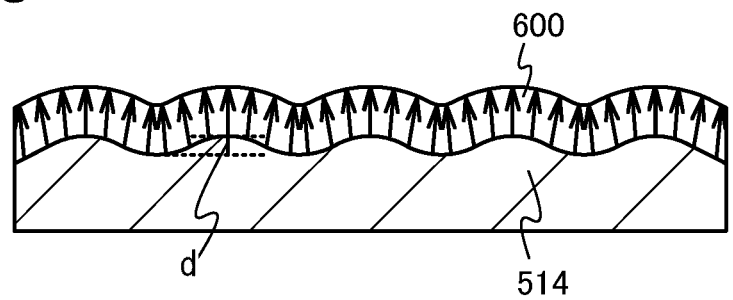

Here, how the crystallinity of an oxide semiconductor film 600 which is deposited over a formation surface 514 changes in accordance with the planarity of the formation surface 514 will be described with reference to FIGS. 8A to 8C. FIGS. 8A to 8C are enlarged views each illustrating the formation surface 514 and the oxide semiconductor film 600. Note that in FIGS. 8A to 8C, an arrow in the oxide semiconductor film 600 represents a direction in which a crystal included in the oxide semiconductor film 600 grows.

When the planarity of the surface of the formation surface 514 is low as illustrated in FIG. 8A, crystals grow substantially perpendicularly to inclined planes of projections of the formation surface 514. Accordingly, the oxide semiconductor film 600 is formed to be a layer substantially parallel to the inclined planes of the projections of the surface of the formation surface 514. However, in a region 602a which corresponds to a top of the projection of the formation surface 514, the direction in which crystals grow varies depending on a region. Therefore, the arrangement of the crystals formed in the layer substantially parallel to the inclined planes of the projections of the formation surface 514 is divided in the region 602a. Further, in a region 602b which corresponds to a bottom of a valley between projections of the formation surface 514, directions in which crystals around the region 602b grow intersect with each other. Therefore, the arrangement of the crystals formed in the layer substantially parallel to the inclined planes of the projections of the formation surface 514 is divided in the region 602b.

When the layered arrangement of crystals of the oxide semiconductor film is divided in this manner, a crystal grain boundary is generated. A dangling bond exists at the crystal grain boundary and forms a defect level in the bandgap of the oxide semiconductor film. Such a dangling bond at a crystal grain boundary mainly serves to trap a carrier and decreases the carrier mobility of the oxide semiconductor film, so that the resistance of the oxide semiconductor film is increased. Further, when the dangling bond is bonded to a hydrogen atom or the like, a donor level is formed in the bandgap of the oxide semiconductor film. Consequently, use of the oxide semiconductor film for a semiconductor device such as a transistor leads to change in the electric conductivity of a portion corresponding to the region 602a or the region 602b and a decrease in the mobility of the semiconductor device.

In contrast, when the planarity of the formation surface 514 is sufficiently high as illustrated in FIG. 8B, portions corresponding to the region 602a and the region 602b in FIG. 8A are not formed; therefore, the arrangement of the crystals formed in a layer substantially parallel to the formation surface 514 can be continuously provided. The oxide semiconductor film 600 illustrated in FIG. 8B is provided in a semiconductor device such as a transistor, whereby the electrical stability of the semiconductor device can be obtained and a decrease in the mobility thereof can be suppressed.

Even when projections are formed on the formation surface 514 as illustrated in FIG. 8C, in the case where the projections are sufficiently gentle, the continuous layered arrangement of crystals formed substantially parallel to inclined planes of the projections of the formation surface 514 is provided without being divided in portions corresponding to the region 602a and the region 602b in FIG. 8A. Specifically, as described above, the oxide semiconductor film 600 is preferably formed over a surface with an average surface roughness ($R_a$) of less than or equal to 1 nm, preferably less than or equal to 0.3 nm.

As described above, by forming the crystalline oxide semiconductor film over and in contact with the formation surface 514 whose surface roughness is reduced, the density of grain boundary defects in the oxide semiconductor film 600 can be reduced. Accordingly, the crystallinity of the oxide semiconductor film 600 can be further improved, and thus the electrical stability and mobility of the semiconductor device 150 including the oxide semiconductor layer 104 formed using the oxide semiconductor film 600 can be improved.

The formation surface 514 is preferably planarized by chemical mechanical polishing (CMP) treatment. Here, the CMP treatment is a method of planarizing a surface of an object to be processed by a combination of chemical and mechanical actions with the use of the surface as a reference. In general, the CMP treatment is treatment in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing of the object to be processed with the polishing cloth.

The CMP treatment may be performed once or plural times. When the CMP treatment is performed plural times, first polishing is preferably performed with a high polishing rate followed by final polishing with a low polishing rate. By performing polishing at different polishing rates, the planarity of the formation surface 514 can be further improved.

As treatment for planarizing the formation surface 514, dry etching treatment or the like can be performed instead of the CMP treatment. As an etching gas, a chlorine-based gas such as chlorine, boron chloride, silicon chloride, or carbon tetrachloride; a fluorine-based gas such as carbon tetrafluoride, sulfur fluoride, or nitrogen fluoride; oxygen; or the like can be used as appropriate. For example, a dry etching method such as an reactive ion etching (RIE) method, an inductively coupled plasma (ICP) etching method, an electron cyclotron resonance (ECR) etching method, a parallel-plate (capacitively coupled plasma) etching method, a magnetron plasma etching method, a dual-frequency plasma etching method, or a helicon wave plasma etching method can be used. In particular, when the formation surface 514 includes an inorganic insulating material containing a large amount of nitrogen, such as silicon nitride or silicon nitride oxide, it might be difficult to remove the inorganic insulating material containing a large amount of nitrogen only by the CMP treatment; therefore, CMP treatment and dry etching or the like are preferably performed in combination.

As treatment for planarizing the formation surface 514, plasma treatment or the like can also be performed instead of the CMP treatment. The plasma treatment is performed in such a manner that an inert gas such as an argon gas is introduced into a vacuum chamber and an electric field is applied so that a surface to be processed serves as a cathode. The plasma treatment has a principle similar to that of a plasma dry etching method, and is a simpler method because treatment in a general sputtering deposition chamber is possible by using an inert gas. That is, the plasma treatment is treatment in which the surface to be processed is irradiated with ions of an inert gas and minute unevenness of the surface is reduced by a sputtering effect. Therefore, the plasma treatment is also referred to as "reverse sputtering" in this specification.

Note that in the case where a CAAC-OS film is used as the oxide semiconductor layer 104, any of the following three methods may be employed. A first method is a method in which an oxide semiconductor film is deposited at a temperature higher than or equal to 200° C. and lower than or equal to 450° C. A second method is a method in which after an oxide semiconductor film is deposited, heat treatment is performed on the oxide semiconductor film at a temperature higher than or equal to 200° C. and lower than or equal to 700° C. A third method is a method in which two layers are deposited for formation of the oxide semiconductor film. After a first oxide semiconductor film with a small thickness is deposited, heat treatment is performed on the oxide semiconductor film at a temperature higher than or equal to 200° C. and lower than or equal to 700° C., so that the first oxide semiconductor film serves as a CAAC-OS film. Then, a second oxide semiconductor film is deposited over the first oxide semiconductor film, whereby the second oxide semiconductor film using a crystal in the first oxide semiconductor film as a seed crystal is obtained as a CAAC-OS film.

Note that the oxide semiconductor layer 104 may have a structure in which a plurality of oxide semiconductor films are stacked. For example, the oxide semiconductor layer 104 may have a stacked-layer structure of a first oxide semiconductor film and a second oxide semiconductor film which are formed using metal oxides with different compositions. For example, the first oxide semiconductor film may be formed using a three-component metal oxide, and the second oxide semiconductor film may be formed using a two-component metal oxide. Alternatively, for example, both the first oxide semiconductor film and the second oxide semiconductor film may be formed using a three-component metal oxide.

Further, the constituent elements of the first oxide semiconductor film and the second oxide semiconductor film may be the same and the composition ratios of the constituent elements of the first oxide semiconductor film and the second oxide semiconductor film may be different. For example, the first oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film may have an atomic ratio of In:Ga:Zn=1:3:2, and the second oxide semiconductor film may have an atomic ratio of In:Ga:Zn=2:1:3.

Further, the oxide semiconductor layer 104 may have a stacked-layer structure including three or more layers in which an amorphous oxide semiconductor film is interposed between a plurality of oxide semiconductor films having a crystallinity. Furthermore, a structure in which an oxide semiconductor film having a crystallinity and an amorphous oxide semiconductor film are alternatively stacked may be employed. These two structures used so that the oxide semiconductor layer 104 has a stacked-layer structure including a plurality of layers can be combined as appropriate.

Note that in the case where the oxide semiconductor layer 104 has a stacked-layer structure including a plurality of layers, oxygen may be introduced each time the oxide semiconductor film is formed. Oxygen can be introduced by the oxygen supply film formed over the substrate 100 having an insulating surface. Note that in plasma treatment under an atmosphere containing oxygen, the plasma treatment is performed in a state where a DC bias is applied to the substrate side (a bias application apparatus provided on the substrate side or the substrate itself), whereby oxygen plasma is likely to enter the oxide semiconductor layer 104, which is preferable. The applied bias power may be adjusted as appropriate in consideration of the thickness of the oxide semiconductor layer 104 or damage to the oxide semiconductor layer 104 by practitioners.

Oxygen is introduced each time the oxide semiconductor film is formed, whereby the effect of reducing oxygen vacancy in the oxide semiconductor can be improved.

Note that in the case where dry etching is used for etching the oxide semiconductor layer, as an etching gas, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

Note that before the oxide semiconductor film is formed by a sputtering method, dust attached to a surface on which the oxide semiconductor film is to be formed is preferably removed by reverse sputtering in which an argon gas is introduced and plasma is generated. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

Note that the oxide semiconductor layer 104 formed by the above-described method contains moisture or hydrogen (including a hydroxyl group) as an impurity in some cases. Moisture or hydrogen easily forms donor levels and thus serves as an impurity in the oxide semiconductor. In order to reduce impurities such as moisture and hydrogen in the oxide semiconductor layer 104 (dehydrate or dehydrogenate the oxide semiconductor film), the oxide semiconductor layer 104 may be subjected to heat treatment for dehydration or dehydrogenation (hereinafter abbreviated to first heat treatment) in a reduced-pressure atmosphere, an inert gas atmosphere such as a nitrogen atmosphere or a rare gas atmosphere, an oxygen gas atmosphere, or the like.

The oxide semiconductor layer 104 is subjected to the first heat treatment, whereby moisture or hydrogen in the oxide semiconductor layer 104 can be desorbed. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for approximately three minutes to six minutes, inclusive. When an RTA method is used for the heat treatment, dehydration or dehydrogenation can be performed in a short time; therefore, treatment can be performed even at a temperature higher than the strain point of a glass substrate.

Note that the heat treatment apparatus is not limited to an electric furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the first heat treatment, it is preferable that moisture, hydrogen, or the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), more preferably greater than or equal to 7 N (99.99999%) (i.e., the impurity concentration is preferably less than or equal to 1 ppm, more preferably less than or equal to 0.1 ppm).

Further, a second heat treatment may be performed on the oxide semiconductor layer 104 which has been subjected to the first heat treatment. By performing the second heat treatment in an oxidation atmosphere, oxygen is supplied to the oxide semiconductor layer 104; oxygen vacancy caused in the oxide semiconductor layer 104 by the first heat treatment is accordingly filled. Thus, the second heat treatment may be referred to as an oxygen supplying treatment. The second heat treatment may be performed at a temperature of higher than or equal to 200° C. and lower than the strain point of the substrate, and is preferably performed at a temperature of higher than or equal to 250° C. and lower than or equal to 450° C. The treatment time is 3 minutes to 24 hours. As the treatment time is increased, the proportion of a crystal region with respect to that of an amorphous region in the oxide semiconductor layer 104 can be increased; however, heat treatment for longer than 24 hours is not preferable because the productivity is lowered.

The oxidizing atmosphere is an atmosphere containing an oxidizing gas. Oxidizing gas is oxygen, ozone, nitrous oxide, or the like, and it is preferable that the oxidizing gas does not contain water, hydrogen, and the like. For example, the purity of oxygen, ozone, or nitrous oxide introduced into a heat treatment apparatus is set to higher than or equal to 6N (99.9999%), preferably higher than or equal to 7N (99.99999%) (i.e., the impurity concentration is lower than 1 ppm, preferably lower than 0.1 ppm). As the oxidizing atmosphere, an oxidizing gas and an inert gas may be mixed to be used. In that case, the mixture contains an oxidizing gas at a concentration of greater than or equal to 10 ppm. Further, an inert atmosphere refers to an atmosphere containing an inert gas (such as nitrogen or a rare gas (e.g., helium, neon, argon, krypton, or xenon)) as the main component. Specifically, the concentration of a reactive gas such as an oxidizing gas is lower than 10 ppm.

Note that the second heat treatment can be performed using the same heat treatment apparatus and the same gas as those used for the first heat treatment. It is preferable that the first heat treatment for dehydration or dehydrogenation and the second heat treatment for oxygen supply be successively performed. When the first heat treatment and the second heat treatment are successively performed, the productivity of a semiconductor device can be increased.

Next, the first electrode 110 which overlaps with the drain electrode 102b and the oxide semiconductor layer 104 is formed over the oxide semiconductor layer 104, and after that, the gate insulating layer 106 is formed over the first electrode 110 and the oxide semiconductor layer 104. Thus, the capacitor 130 in which the drain electrode 102b serves as a lower electrode, the oxide semiconductor layer 104 servers as a dielectric film, and the first electrode 110 serves as an upper electrode is formed (see FIG. 2C).

The first electrode 110 may be formed using a material and a method which are similar to those of the source electrode 102a and the drain electrode 102b. Although not illustrated, the first electrode 110 is electrically connected to a fixed potential such as a ground potential or a common potential. Since part of the transistor (the drain electrode 102b in FIG. 2C) is shared between the capacitor 130 and the transistor, the capacitor 130 can be formed so as to partially overlap with the transistor 120. Accordingly, the degree of integration of the semiconductor device 150 can be increased as compared to the case where the transistor 120 and the capacitor 130 are formed in different regions.

For the gate insulating layer 106, an oxide semiconductor film having a sufficient withstand voltage and a sufficient insulating property is preferably used. The gate insulating layer 106 can be formed by a vacuum deposition method, a physical vapor deposition (PVD) method such as a sputtering method, or a chemical vapor deposition (CVD) method such as a plasma CVD method to have a single-layer structure or a stacked-layer structure of a silicon oxide film, a silicon oxynitride film, a silicon nitride film, a silicon nitride oxide film, an aluminum oxide film, an aluminum nitride film, an aluminum oxynitride film, an aluminum nitride oxide film, a gallium oxide film, a yttrium oxide film, a lanthanum oxide film, or the like. A high-k material film such as a hafnium oxide film, a hafnium silicate film ($HfSi_xO_y$ (x>0, y>0)), a hafnium silicate film to which nitrogen is added ($HfSiO_xN_y$ (x>0, y>0)), or a hafnium aluminate film ($HfAl_xO_y$ (x>0, y>0)), may be used as at least part of the gate insulating layer 106. Thus, gate leakage current can be reduced.

There is no particular limitation on the thickness of the gate insulating layer 106; however, in the case where a semiconductor device is miniaturized, the thickness is preferably small in order to ensure operation of the semiconductor device 150. For example, in the case where silicon oxide is used, the thickness can be set to greater than or equal to 1 nm and less than or equal to 100 nm, preferably greater than or equal to 10 nm and less than or equal to 50 nm. For example, the gate insulating layer 106 may be formed using a stacked film in which 10-nm-thick aluminum oxide is formed over 30-nm-thick silicon oxide.

Note that it is preferable that an oxide insulating film (also referred to as an oxygen supply film) be used as the gate insulating layer 106 because part of oxygen in the oxide insulating film is released by heat treatment and supplied to the oxide semiconductor layer 104, and the oxygen vacancy in the oxide semiconductor layer 104 can be filled as in the case of using the above-described oxygen supply film formed over the substrate 100 having an insulating surface. Note that there is no particular limitation on the timing when heat treatment is performed on the gate insulating layer 106 as long as it is after the gate insulating layer 106 is deposited.

In particular, the gate insulating layer 106 preferably contains a large amount of oxygen which exceeds at least the stoichiometry in (a bulk of) the gate insulating layer 106. For example, a film of silicon oxide represented by the formula $SiO_{2+\alpha}$ ($\alpha>0$) is preferably used as the gate insulating layer 106. When such an oxide silicon film is used as the gate insulating layer 106, oxygen can be supplied to the oxide semiconductor layer 104, so that the transistor 120 using the oxide semiconductor layer 104 can have favorable transistor characteristics.

The gate insulating layer 106 is preferably formed using a film deposited by a method in which an impurity such as hydrogen or water does not enter the film. This is because, when an impurity such as hydrogen or water is included in the gate insulating layer 106, the impurity such as hydrogen or water enters the oxide semiconductor layer 104 formed in the above-described step or oxygen in the oxide semiconductor layer 104 is extracted by the impurity such as hydrogen or water, so that a channel of the oxide semiconductor layer 104 might have lower resistance (have n-type conductivity) and a parasitic channel might be formed. Therefore, the gate insulating layer 106 is preferably formed so as to include an impurity such as hydrogen or water as few as possible. For example, the gate insulating layer 106 is preferably formed by a sputtering method. It is preferable to use a high-purity gas from which an impurity such as hydrogen or water is removed as a sputtering gas when the gate insulating layer 106 is formed.

Many oxide semiconductor materials that can be used for forming the oxide semiconductor layer 104 include an element of Group 13. Therefore, in the case where the gate insulating layer 106 in contact with the oxide semiconductor layer 104 is formed using a material including a Group 13 element and oxygen, the state of the interface between the oxide semiconductor layer 104 and the gate insulating layer 106 can be kept favorable. This is because a material including a Group 13 element and oxygen which is used for forming the gate insulating layer 106 is compatible with an oxide semiconductor material which is used for forming the oxide semiconductor layer 104. For example, when the oxide semiconductor layer 104 and the gate insulating layer 106 including gallium oxide are provided in contact with each other, pileup of hydrogen at the interface between the oxide semiconductor layer 104 and the gate insulating layer 106 can be reduced.

The gate insulating layer 106 is preferably formed using aluminum oxide through which moisture (including water, water vapor, and hydrogen) is not easily transmitted, because entry of moisture to the oxide semiconductor layer 104 is prevented. In addition, since aluminum oxide has a property of not easily penetrating oxygen, release of oxygen (including excess oxygen) contained in the gate insulating layer 106 to the gate electrode 108 side by third heat treatment performed later can be suppressed; accordingly, oxygen vacancy in the oxide semiconductor layer 104 can be effectively filled. Further, a film having a stacked-layer structure in which an oxygen supply film (e.g., a silicon oxide film containing excess oxygen) is formed in contact with the oxide semiconductor layer 104 and a bather film (e.g., an aluminum oxide film) is formed over the oxygen supply film may be used as the gate insulating layer 106. With this structure, oxygen released from the oxygen supply film by heat treatment or the like can be supplied efficiently to the oxide semiconductor layer 104 side.

As described above, when the gate insulating layer 106 is made thin, there is a problem of gate leakage due to a tunneling effect or the like. In order to solve the problem of gate leakage, the gate insulating layer 106 may be formed using a high dielectric constant (high-k) material such as hafnium oxide, tantalum oxide, yttrium oxide, hafnium silicate (Hf-$Si_xO_y$ (x>0, y>0)), hafnium silicate (HfSi$_x$O$_y$ (x>0, y>0)) to which nitrogen is added, or hafnium aluminate (HfAl$_x$O$_y$ (x>0, y>0)) to which nitrogen is added. The use of a high-k material for the gate insulating layer 106 makes it possible to increase the thickness in order to suppress gate leakage as well as ensuring electrical properties of the gate insulating layer 106. Note that a stacked-layer structure of a film containing a high-k material and a film containing any one of silicon oxide, silicon nitride, silicon oxynitride, silicon nitride oxide, aluminum oxide, and the like may be employed.

Note that oxygen adding treatment may be performed on the oxide semiconductor layer 104 either after formation of the oxide semiconductor layer 104 or after formation of the gate insulating layer 106 or at both of the timings. Here, the "oxygen adding treatment" means adding oxygen (which includes at least one of an oxygen radical, an oxygen atom, and an oxygen ion) to a bulk of the oxide semiconductor layer 104. Note that the term "bulk" is used in order to clarify that oxygen is added not only to a surface of a thin film but also to the inside of the thin film. In addition, "oxygen adding" includes "oxygen plasma doping" in which oxygen which is made to be plasma is added to a bulk. By performing the oxygen adding treatment, the proportion of oxygen included in the oxide semiconductor layer 104 and the gate insulating layer 106 can be made larger than the stoichiometric proportion.

For the oxygen adding treatment, heat treatment under an oxygen atmosphere, an ion implantation method, an ion doping method, a plasma immersion ion implantation method, plasma treatment performed under an atmosphere containing oxygen, or the like can be employed. The oxygen adding treatment is preferably performed by an inductively coupled plasma (ICP) method with the use of oxygen plasma which is excited by a microwave (with a frequency of 2.45 GHz, for example) because the gate insulating layer 106 is less damaged and excess oxygen is added sufficiently.

After the gate insulating layer 106 is formed, the third heat treatment is preferably performed under an inert gas atmosphere or an oxygen atmosphere. The third heat treatment is performed at a temperature higher than or equal to 200° C. and lower than or equal to 450° C., preferably higher than or equal to 250° C. and lower than or equal to 350° C. For example, the third heat treatment may be performed at 250° C. for 1 hour under a nitrogen atmosphere. By performing the third heat treatment, variation in electrical characteristics of the transistor can be reduced. Moreover, in the case where a film in contact with the oxide semiconductor layer 104, for example, the gate insulating layer 106, includes oxygen, oxygen can be supplied to the oxide semiconductor layer 104 and oxygen vacancy in the oxide semiconductor layer 104 can be filled; thus, an i-type (intrinsic) or substantially i-type oxide semiconductor layer can be formed. Note that in the case where for example, a base film including oxygen is provided in contact with the oxide semiconductor layer 104, the oxygen vacancy can be also filled with the base film.

Note that the third heat treatment is performed in this embodiment after the gate insulating layer 106 is formed; however, the timing of the third heat treatment is not limited to this. For example, the third heat treatment may be performed after the gate electrode 108 is formed.

By performing the third heat treatment as described above, the oxide semiconductor layer 104 can be highly purified so as to include the substance including a hydrogen atom as few as possible.

Next, the gate electrode 108 which overlaps with the gap between the source electrode 102a and the drain electrode 102b, is extended toward the first electrode 110 so as to overlap with the first electrode 110, and is provided over the gate insulating layer 106 is formed. Thus, the transistor 120 is formed (see FIG. 2D).

The gate electrode 108 may be formed in such a manner that first, a conductive film is formed over the gate insulating layer 106 by an evaporation method, a physical vapor deposition (PVD) method such as a sputtering method, or a chemical vapor deposition (CVD) method such as a plasma CVD method, a resist for obtaining a desired pattern shape is formed over the conductive film by a known technique such as a photolithography method or an ink-jet method, and an unnecessary portion of the conductive film is selectively removed using a known technique such as a dry etching method or a wet etching method.

As a material of the conductive film, a metal material such as molybdenum, titanium, tantalum, tungsten, aluminum, copper, neodymium, magnesium, or scandium or an alloy material containing any of these materials as a main component can be used. Alternatively, the conductive film may be formed using conductive metal oxide. As the conductive metal oxide, indium oxide ($In_2O_3$), tin oxide ($SnO_2$), zinc oxide (ZnO), an indium tin oxide ($In_2O_3$—$SnO_2$, which is abbreviated to ITO in some cases), an indium zinc oxide ($In_2O_3$—ZnO), or any of these metal oxide materials in which silicon or silicon oxide is contained can be used. The gate electrode 108 may have a single-layer structure or a stacked-layer structure including a combination of the above materials.

There is no particular limitation on the thickness of the gate electrode 108; however, when the thickness is too large, the productivity of a semiconductor device may be lowered. Therefore, the thickness is greater than or equal to 10 nm and less than or equal to 1000 nm, preferably greater than or equal to 50 nm and less than or equal to 500 nm. For example, the gate electrode 108 may be formed using a stacked film in which a 300 nm-thick aluminum film is formed over a 100 nm-thick titanium film as a conductive film.

Figure 3A:
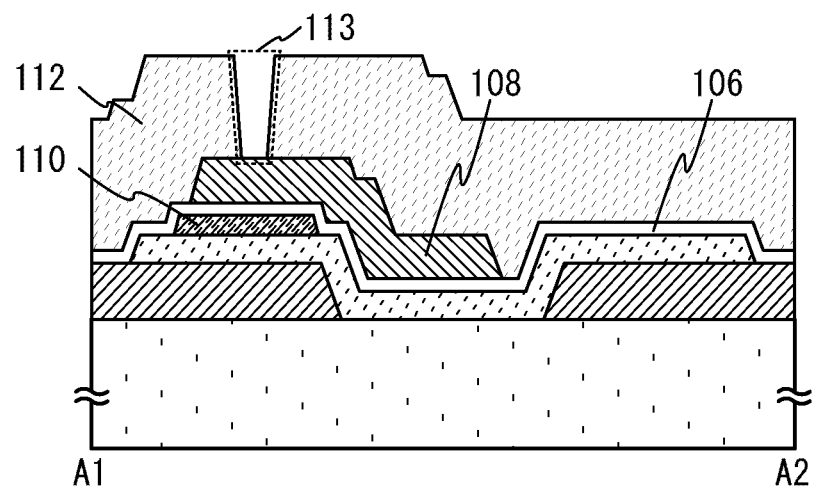
FIGS. 3A and 3B are views illustrating the method for manufacturing the semiconductor device described in Embodiment 1.
Figure 3B:
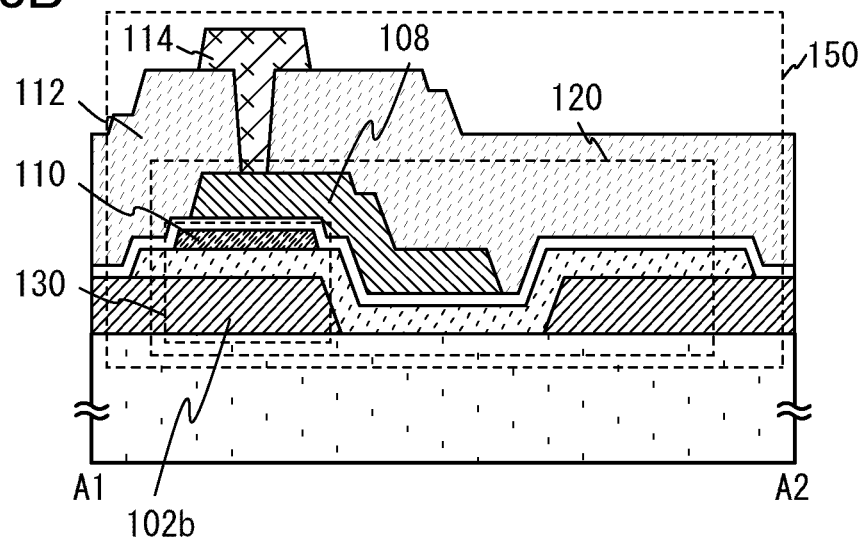

Next, the interlayer insulating layer 112 which covers the gate insulating layer 106 and the gate electrode 108 is deposited, and a contact hole 113 through which at least part of the gate electrode 108 is exposed is formed in the interlayer insulating layer 112 which overlaps with the first electrode 110 and the gate electrode 108 (see FIG. 3A).

The interlayer insulating layer 112 can be formed using a method and a material similar to those of the gate insulating layer 106. Alternatively, the interlayer insulating layer 112 may be formed in such a manner that an organic material having an insulating property is applied by a spin coating method, a printing method, a dispensing method, an ink-jet method, or the like, and cure treatment (e.g., heat treatment or light irradiation treatment) is performed depending on the applied material. As an organic material having an insulating property, for example, an organic resin such as an acrylic resin, a polyimide resin, a polyamide resin, a polyamide-imide resin, or an epoxy resin can be used. In addition to such resin materials, it is also possible to use a low-dielectric constant material (low-k material), a siloxane-based resin, phosphosilicate glass (PSG), borophosphosilicate glass (BPSG), or the like. Note that the interlayer insulating layer 112 may be formed by stacking a plurality of insulating films formed using any of these materials. It is preferable that a film having a low water vapor permeability such as a barrier film (e.g., a film of an aluminum oxide or a stacked film including an aluminum oxide) be formed under the film formed using an organic material because the above-described organic material contains a relatively large amount of impurities such as moisture in many cases. Thus, an impurity (e.g., moisture) which is contained in the interlayer insulating layer 112 or enters from the outside through the interlayer insulating layer 112 and which may adversely affect the electric characteristics of the transistor 120 can be prevented from diffusing into the oxide semiconductor layer 104, so that the transistor 120 can have favorable electric characteristics.

Next, the wiring 114 which overlaps with the first electrode 110 and the gate electrode 108 and is electrically connected to the gate electrode 108 (also referred to as the wiring 114 which is electrically connected to the gate electrode 108 through the contact hole 113) is formed over the interlayer insulating layer 112. Through the above-described process, the semiconductor device 150 including the transistor 120 and the capacitor 130 is completed (see FIG. 3B). The transistor 120 and the capacitor 130 share some components, so that the semiconductor device 150 can be formed efficiently in a small number of steps, which leads to reduction in manufacturing time and manufacturing cost of the semiconductor device 150. Further, since the capacitor 130 can be provided so as to overlap with part of the transistor 120, the semiconductor device 150 can be highly integrated.

In general, in the case where the gate electrode 108 is connected to a wiring provided over the interlayer insulating layer 112 through a contact hole, the gate electrode 108 overlaps with the drain electrode 102b serves as parasitic capacitance, which may adversely affect the transistor or the semiconductor device. However, as in this embodiment, the first electrode connected to a fixed potential such as a ground potential or a common potential exists between the drain electrode 102b and the gate electrode 108, whereby the adverse effect can be suppressed and the gate electrode 108 can be connected to the wiring over the interlayer insulating layer at a position which overlaps with the capacitor 130, so that the semiconductor device 150 can be further highly integrated.

The methods and structures described in this embodiment can be combined as appropriate with any of the methods and structures described in the other embodiments.

Embodiment 2

In this embodiment, one embodiment of a structure and a manufacturing method of a semiconductor device whose structure is different from that described in Embodiment 1 will be described with reference to FIGS. 5A to 5C and FIGS. 6A to 6C.

<Example of Structure of Semiconductor Device>

Figure 5A:
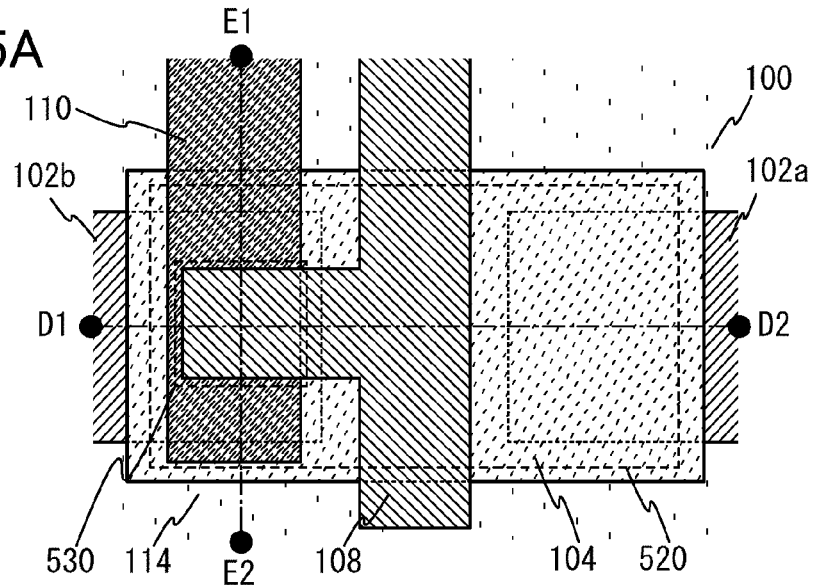
FIGS. 5A to 5C are views illustrating a structure of a semiconductor device described in Embodiment 2.
Figure 5B:
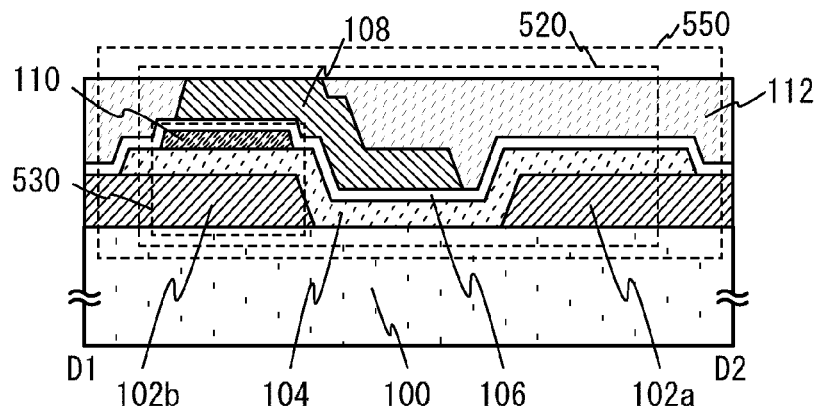
Figure 5C:
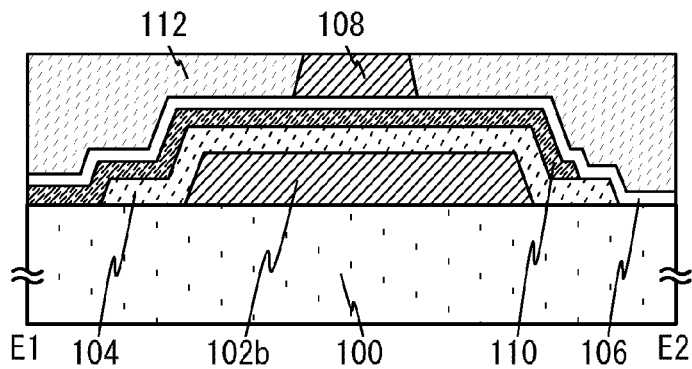

FIGS. 5A to 5C illustrate an example of a structure of a semiconductor device 550 manufactured by a method described in this embodiment. FIG. 5A is a top view of the semiconductor device 550, FIG. 5B is a cross-sectional view taken along dashed-dotted line D1-D2 in FIG. 5A, and FIG. 5C is a cross-sectional view taken along dashed-dotted line E1-E2 in FIG. 5A. Note that in the top view of FIG. 5A, the gate insulating layer 106 and the interlayer insulating layer 112 are omitted for easy understanding of the structure.

The semiconductor device 550 illustrated in FIGS. 5A to 5C includes a transistor 520 and a capacitor 530. Note that the transistor 520 includes the same components as the transistor 120 described in Embodiment 1, and the capacitor 530 includes the same components as the capacitor 130 described in Embodiment 1.

The semiconductor device 550 described in this embodiment is different from the semiconductor device described in Embodiment 1 in that the gate electrode 108 is connected to a wiring provided over the interlayer insulating layer 112 without using the contact hole in such a manner that the interlayer insulating layer 112 is formed and subjected to a planarization treatment so that part of the gate electrode 108 is exposed on a surface of the interlayer insulating layer 112. In the structure described in this embodiment, the gate electrode 108 can be connected to the wiring provided over the interlayer insulating layer 112 without using a mask for forming the contact hole. This is achieved by utilizing the fact that the gate electrode positioned over the first electrode 110 (over the capacitor 530) is positioned at the highest level (provided convexly). After the interlayer insulating layer 112 is formed over the gate electrode 108, the interlayer insulating layer 112 is subjected to a planarization treatment to expose the gate electrode 108 positioned over the first electrode 110 (over the capacitor 530). Accordingly, without a process which needs a mask, such as a process in which a contact hole is formed in a predetermined portion of the interlayer insulating layer 112, the gate electrode 108 can be connected to the wiring provided over the interlayer insulating layer 112, which leads to further reduction in manufacturing time and manufacturing cost of the semiconductor device.

Further, since a contact hole is not formed using a mask, in principle, problems such as misalignment of the contact hole due to an apparatus and malfunction of the transistor do not occur, so that production yield of the semiconductor device can be improved <Method for Manufacturing Semiconductor Device>

A method for manufacturing the semiconductor device 550 described in this embodiment will be described below with reference to FIGS. 6A to 6C.

Figure 6A:
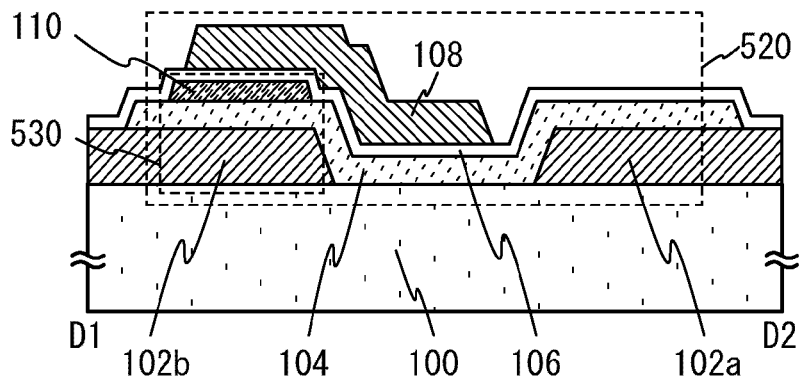
FIGS. 6A to 6C are views illustrating a method for manufacturing the semiconductor device described in Embodiment 2.

First, the transistor 520 and the capacitor 530 are formed over the substrate 100 in the manner indicated by FIGS. 2A to 2D and the description corresponding to FIGS. 2A to 2D (see FIG. 6A). Refer to the description in Embodiment 1 for a manufacturing method or a material of each of the components included in the transistor 520 and the capacitor 530 (e.g., the source electrode 102a or the drain electrode 102b).

Figure 6B:
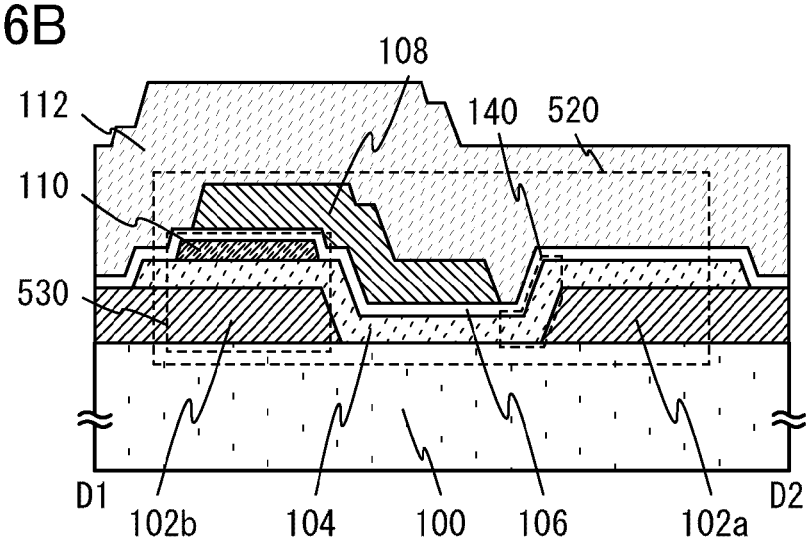

Next, the interlayer insulating layer 112 is formed over the transistor 520 and the capacitor 530 (see FIG. 6B). Refer to the description in Embodiment 1 for the manufacturing method or the material of the interlayer insulating layer 112.

Next, the interlayer insulating layer 112 is subjected to a planarization treatment to expose at least the gate electrode 108 which is positioned over the first electrode 110 (over the capacitor 530). As the planarization treatment, chemical mechanical polishing (CMP) treatment or a dry etching method may be used. Note that the CMP treatment may be performed only once or plural times. When the CMP treatment is performed plural times, first polishing is preferably performed with a high polishing rate followed by final polishing with a low polishing rate.

Figure 6C:
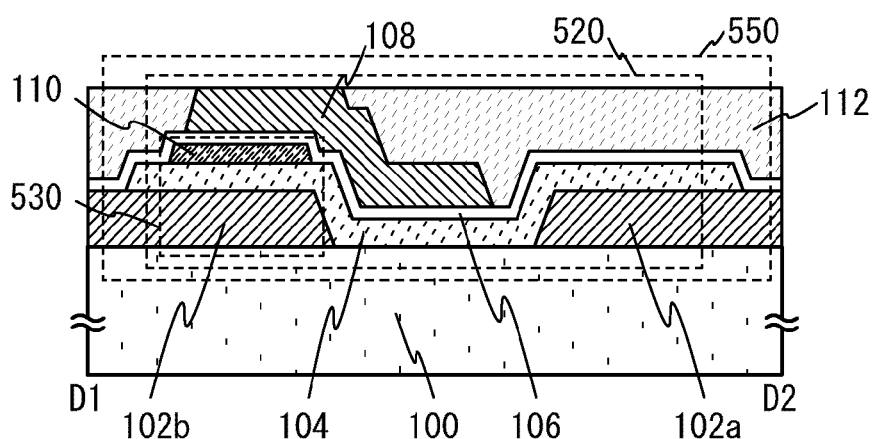

Through the above-described process, the semiconductor device 550 illustrated in FIGS. 5A to 5C can be manufactured (see FIG. 6C).

Embodiment 3

In this embodiment, an example of a case where the semiconductor device described in any of the above embodiments is used as a semiconductor device (also referred to as a memory device) in which stored data can be retained even when power is not supplied and the number of write cycles is not limited will be described with reference to FIGS. 7A and 7B. Note that in this embodiment, the semiconductor device 150 described in Embodiment 1 is used as a memory device. Needless to say, the semiconductor device 550 described in Embodiment 2 may also be used as a memory device.

Figure 7A:
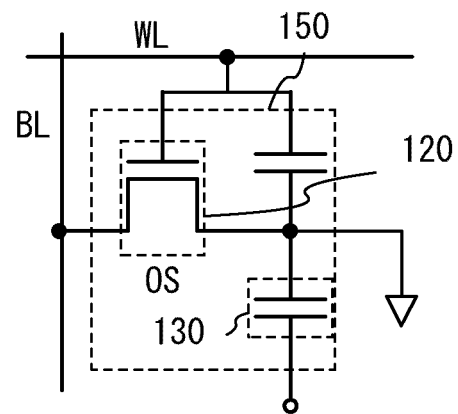
FIGS. 7A and 7B are views each illustrating a memory device including a semiconductor device.
Figure 7B:
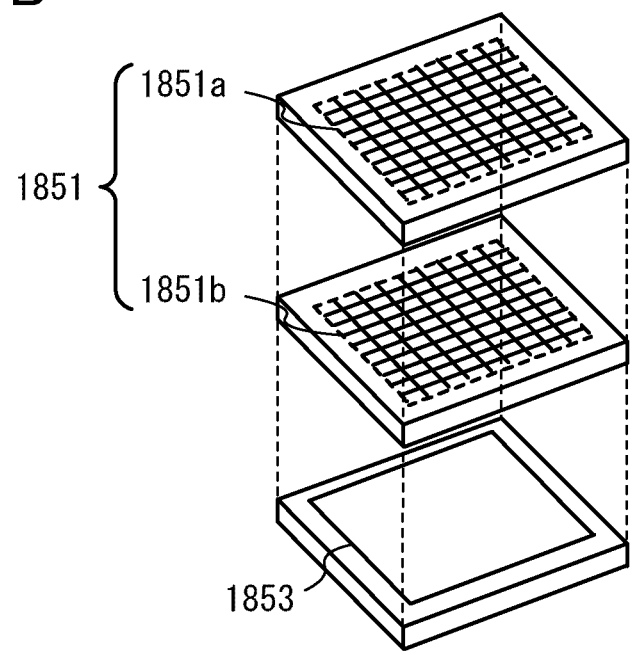

FIG. 7A illustrates an example of a circuit configuration of a semiconductor device, and FIG. 7B is a conceptual diagram illustrating an example of a semiconductor device. First, the semiconductor device illustrated in FIG. 7A will be described, and then, the semiconductor device illustrated in FIG. 7B will be described.

In the semiconductor device illustrated in FIG. 7A, a bit line BL is electrically connected to a source electrode or a drain electrode of the transistor 120, a word line WL is electrically connected to a gate electrode of the transistor 120, and a source electrode or a drain electrode of the transistor 120 is electrically connected to a first terminal of a capacitor 130.

Next, writing and retaining data in the semiconductor device 150 (serving as a memory cell) illustrated in FIG. 7A will be described.

First, the potential of the word line WL is set to a potential at which the transistor 120 is turned on, and the transistor 120 is turned on. Accordingly, the potential of the bit line BL is supplied to the first terminal of the capacitor 130 (writing). After that, the potential of the word line WL is set to a potential at which the transistor 120 is turned off, so that the transistor 120 is turned off. Thus, the potential of the first terminal of the capacitor 130 is retained (retention of the data).

The transistor 120 including an oxide semiconductor has a characteristic of a significantly small off-state current. For that reason, when the transistor 120 is in an off state, a potential of the first terminal of the capacitor 130 (or charge accumulated in the capacitor 130) can be retained for an extremely long period. Note that since a capacitor (the capacitor including the first electrode 110, the gate insulating layer 106, and the gate electrode 108, which is described in Embodiment 1) is provided between the capacitor 130 and the word line WL, electric charge accumulated in the capacitor 130 does not leak to the word line WL.

Next, reading of data will be described. When the transistor 120 is turned on, the bit line BL and the capacitor 130 which are in a floating state are electrically connected to each other, and the charge is redistributed between the bit line BL and the capacitor 130. As a result, the potential of the bit line BL is changed. The amount of change in potential of the bit line BL varies depending on the potential of the first terminal of the capacitor 130 (or the charge accumulated in the capacitor 130).

For example, the potential of the bit line BL after charge redistribution is $(C_B \times V_{B0} + C \times V)/(C_B + C)$, where V is the potential of the first terminal of the capacitor 130, C is the capacitance of the capacitor 130, $C_B$ is the capacitance of the bit line BL (hereinafter also referred to as a bit line capacitance), and $V_{B0}$ is the potential of the bit line BL before the charge redistribution. Therefore, it can be found that assuming that the memory cell 1850 is in either of two states in which the potentials of the first terminal of the capacitor 130 are $V_1$ and $V_0$ ($V_1 > V_0$), the potential of the bit line BL in the case of retaining the potential $V_1$ ($=(C_B \times V_{B0} + C \times V_1)/(C_B \pm C)$) is higher than the potential of the bit line BL in the case of retaining the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 7A can retain charge that is accumulated in the capacitor 130 for a long time because the off-state current of the transistor 120 is extremely small. In other words, power consumption can be adequately reduced because refresh operation becomes unnecessary or the frequency of refresh operation can be extremely low. Moreover, stored data can be retained for a long time even when power is not supplied.

Next, the semiconductor device illustrated in FIG. 7B will be described.

The semiconductor device illustrated in FIG. 7B, as a memory circuit, includes a memory cell array 1851a and a memory cell array 1851b each of which includes a plurality of the semiconductor devices 150 illustrated in FIG. 7A in an upper portion, and includes a peripheral circuit 1853 in a lower portion which is necessary for operating a memory cell array 1851 (the memory cell array 1851a and the memory cell array 1851b). Note that the peripheral circuit 1853 is electrically connected to the memory cell array 1851.

In the structure illustrated in FIG. 7B, the peripheral circuit 1853 can be provided under the memory cell array 1851 (the memory cell array 1851a and the memory cell array 1851b). Thus, the size of the semiconductor device can be decreased.

It is preferable that a semiconductor material of the transistor provided in the peripheral circuit 1853 be different from that of the transistor 120. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably realized by the transistor.

Note that FIG. 7B illustrates, as an example, the semiconductor device in which two memory cell arrays 1851 (the memory cell arrays 1851a and 1851b) are stacked; however, the number of memory cells to be stacked is not limited thereto. Three or more memory cell arrays may be stacked.

As described above, the plurality of memory cell arrays formed in multiple layers in the upper portion is each formed with a transistor including an oxide semiconductor. Since the off-state current of the transistor including an oxide semiconductor is small, stored data can be retained for a long time owing to such a transistor. In other words, the frequency of refresh operation can be extremely lowered, which leads to a sufficient reduction in power consumption.

As described in Embodiment 1, since the semiconductor device 150 has advantages that some components can be shared between the transistor 120 and the capacitor 130, and the gate electrode of the transistor 120 can be connected to a wiring provided over the interlayer insulating layer 112 at the position which overlaps with the capacitor 130, the area of the semiconductor device can be decreased, which leads to high integration.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

Note that this embodiment can be implemented in combination with any of the structures described in other embodiments, as appropriate.

Embodiment 4

In this embodiment, as an application example in which the semiconductor device described in Embodiment 3 is used, a memory medium (memory element) will be described with reference to FIG. 9. Note that in a description of the memory medium in this embodiment, the transistor 120 may be replaced with the transistor 520, the capacitor 130 may be replaced with the capacitor 530, and the semiconductor device 150 may be replaced with the semiconductor device 550.

Figure 9:
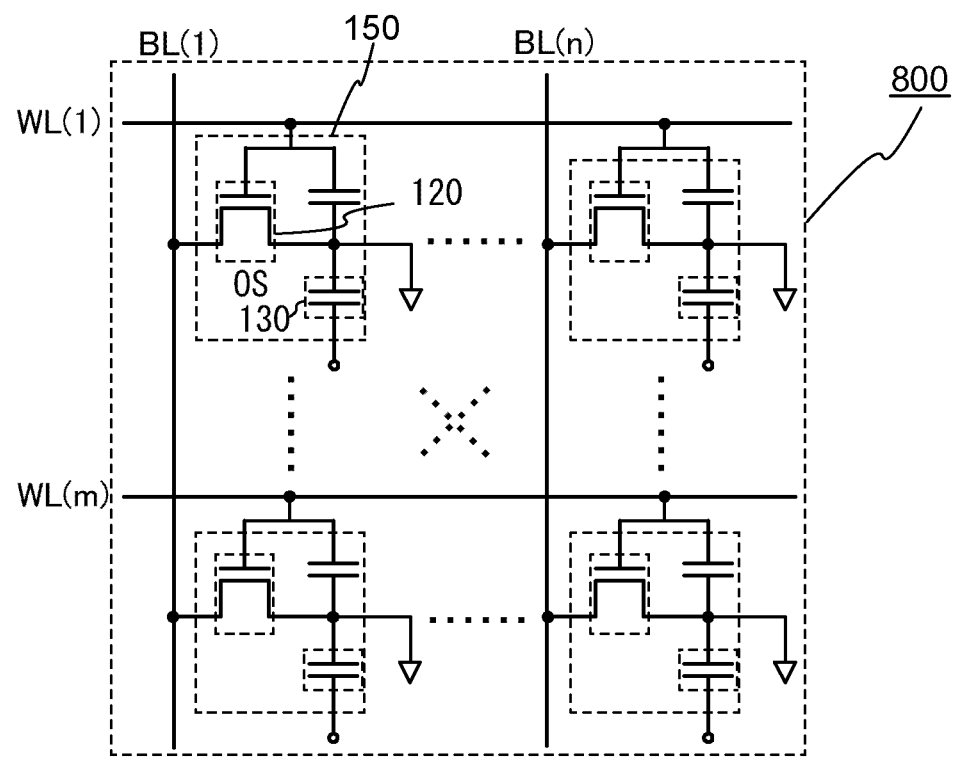
FIG. 9 is a view illustrating a memory device including a semiconductor device.

In FIG. 9, an example of a semiconductor device having a structure corresponding to a so-called dynamic random access memory (DRAM) is illustrated. A memory cell array 800 illustrated in FIG. 9 has a structure in which a plurality of memory cells is arranged in a matrix. Further, the memory cell array 800 includes m first wirings (word lines WL) and n second wirings (bit lines BL). Note that in this embodiment, the first wiring and the second wiring are referred to as a bit line BL and a word line WL, respectively.

The memory cell includes the transistor 120 and the capacitor 130. The semiconductor device 150 described in Embodiment 1 can be used for the memory cell. Further, the gate electrode of the transistor 120 is connected to the first wiring (word line WL). One of the source electrode and the drain electrode of the transistor 120 is connected to the second wiring (bit line BL), the other of the source electrode and the drain electrode of the transistor 120 is connected to one electrode of the capacitor 130. The other electrode of the capacitor 130 is connected to a capacitor line CL and is supplied with a predetermined potential.

In the semiconductor device 150 described in the above embodiment, a highly purified intrinsic oxide semiconductor layer is used as the semiconductor layer of the transistor 120, so that the off-state current of the semiconductor device can be sufficiently reduced. Further, when an oxide semiconductor layer having a crystallinity is formed over and in contact with an insulating film whose surface roughness is reduced, the oxide semiconductor layer can have stable electric conductivity. By using the oxide semiconductor layer for the transistor 120 in the semiconductor device 150, a highly reliable semiconductor device having stable electric characteristics can be provided. Further, with the use of the semiconductor device 150, the semiconductor device in FIG. 9, which is regarded as a so-called DRAM, can substantially be used as a nonvolatile memory.

Further, in the semiconductor device 150, the transistor 120 and the capacitor 130 can share some components, so that the transistor 120 and the capacitor 130 can be formed so as to overlap with each other, which leads to a reduction in the size of the semiconductor device. Thus, the memory cell array 800 can be miniaturized. Further, since the gate electrode of the transistor 120 can be led to the overlying layer at the position which overlaps with the capacitor 130, the memory cell array 800 can be further miniaturized.

The methods and structures described in this embodiment can be combined as appropriate with any of the methods and structures described in the other embodiments.

Embodiment 5

In this embodiment, a central processing unit (CPU) at least part of which includes the memory device described in the above-described embodiment will be described with reference to FIGS. 10A to 10C.

Figure 10A:
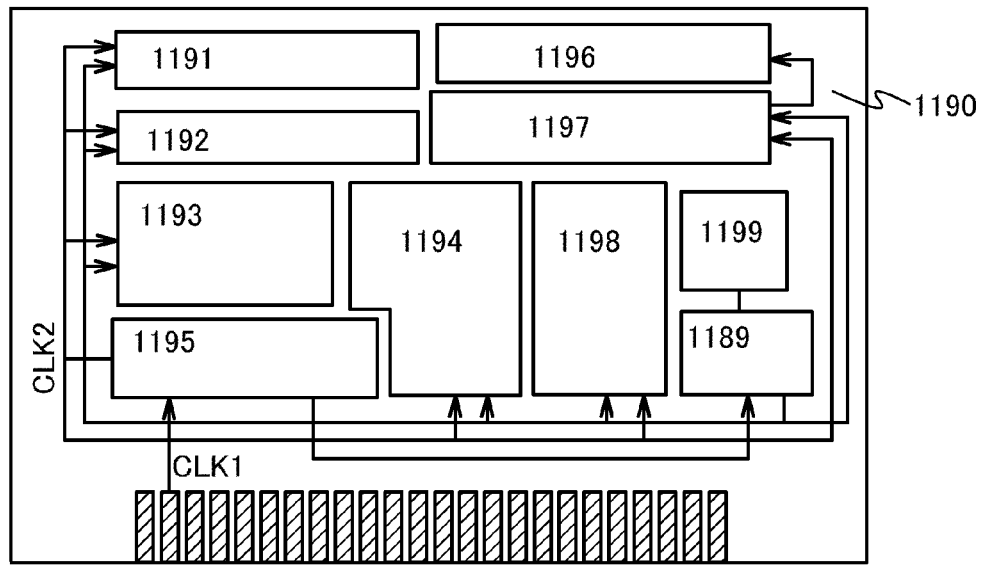
FIGS. 10A to 10C are views illustrating a CPU at least part of which includes a memory device.

FIG. 10A is a block diagram illustrating a specific structure of a CPU. The CPU illustrated in FIG. 10A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 10A is only an example in which the structure is simplified, and an actual CPU may have various structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates a signal for controlling operation of the arithmetic logic unit 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the arithmetic logic unit 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 10A, a memory device is provided in the register 1196. The memory device described in the above-described embodiment can be used as the memory device provided in the register 1196.

In the CPU illustrated in FIG. 10A, the register controller 1197 selects operation of retaining data in the register 1196 in accordance with an instruction from the arithmetic logic unit 1191. That is, the register controller 1197 determined whether data is retained by a phase-inversion element or by a capacitor in the memory device included in the register 1196. When data retention by the phase-inversion element is selected, power supply voltage is supplied to the memory device in the register 1196. When data retention by the capacitor is selected, the data is rewritten in the capacitor, and supply of a power supply voltage to the memory device in the register 1196 can be stopped. The memory device described in the above embodiment is used for the register 1196, whereby after supply of a power supply voltage to the memory device is stopped, data can be retained for a longer time.

Figure 10B:
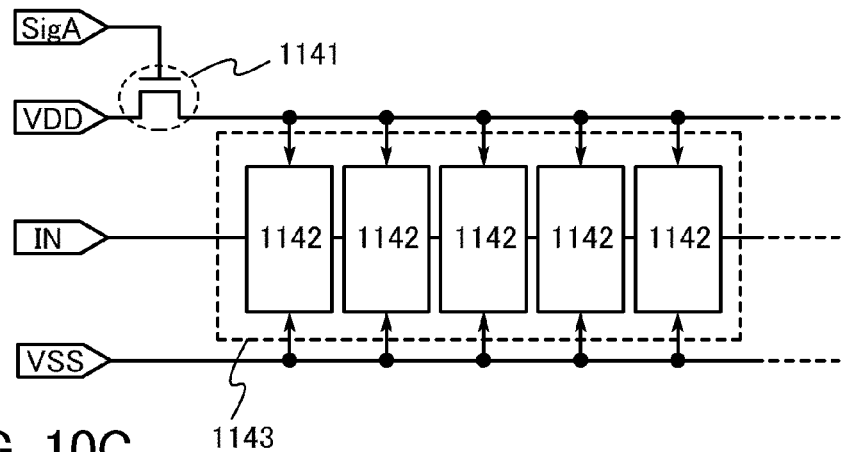
Figure 10C:
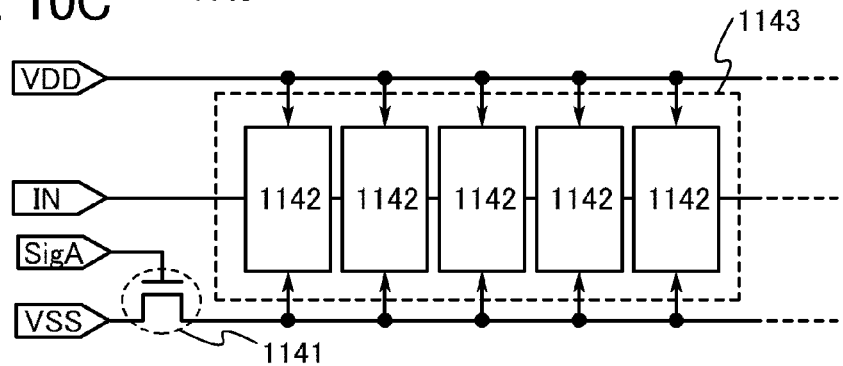

The power supply can be stopped by providing a switching element between a memory element group and a node to which a power supply potential VDD or a power supply potential VSS is supplied, as illustrated in FIG. 10B or FIG. 10C. Circuits illustrated in FIGS. 10B and 10C will be described below.

FIGS. 10B and 10C each illustrate an example of a structure of a memory circuit including a transistor in which a channel formation region is formed using an oxide semiconductor as a switching element for controlling supply of a power supply potential to a memory element.

The memory device illustrated in FIG. 10B includes a switching element 1141 and a memory element group 1143 including a plurality of memory elements 1142. Specifically, in part of each of the memory elements 1142, a structure of the semiconductor device described in each of Embodiments 1 and 2 can be employed. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 10B, a transistor in which a channel formation region is formed using an oxide semiconductor is used for the switching element 1141, and the switching of the transistor is controlled by a signal Sig A supplied to a gate electrode thereof.

Note that FIG. 10B illustrates the structure in which the switching element 1141 includes only one transistor; however, without limitation thereon, the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 10B, the switching element 1141 may control the supply of the low-level power supply potential VSS.

FIG. 10C illustrates an example of a memory device in which each of the memory elements 1142 included in the memory element group 1143 is supplied with the low-level power supply potential VSS via the switching element 1141. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be retained even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

The methods and structures described in this embodiment can be combined as appropriate with any of the methods and structures described in the other embodiments.

Embodiment 6

In this embodiment, the case where the memory device described in the above embodiment is applied to an electronic appliance will be described with reference to FIGS. 11A to 11D. In this embodiment, the case where the above-described semiconductor device is applied to an electronic appliance such as a computer, a portable information terminal (including a mobile phone, a portable game machine, an audio reproducing device, and the like), electronic paper, a television set (also referred to as television or television receiver), or a digital video camera is described.

Figure 11A:
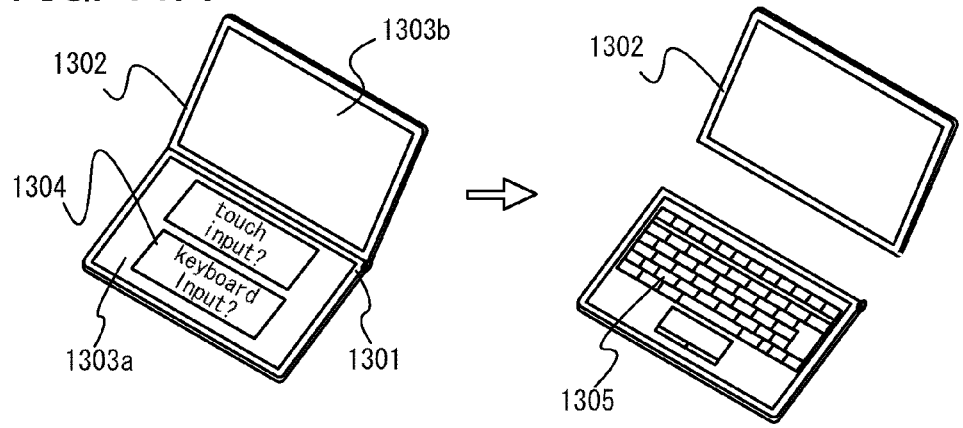
FIGS. 11A to 11D are views each illustrating an electronic appliance.

FIG. 11A illustrates a portable information terminal, which includes a housing 1301, a housing 1302, a first display portion 1303a, a second display portion 1303b, and the like. A variety of electronic components (e.g. CPU, MPU, or a memory element) are incorporated inside the housing 1301 and the housing 1302. Further, electronic circuits (e.g., a driver circuit or a selection circuit) necessary for displaying an image are mounted on the first display portion 1303a and the second display portion 1303b. The semiconductor device described in any of the above embodiments is applied to the electronic components or the electronic circuits, whereby a portable information terminal in which writing and reading of data are performed at high speed, data is retained for a long time, and power consumption is sufficiently reduced can be realized. Note that the semiconductor device described in any of the above embodiments may be provided in at least one of the housing 1301 and the housing 1302.

At least one of the first display portion 1303a and the second display portion 1303b is a touch panel, and for example, as illustrated in the left in FIG. 11A, which of "touch input" and "keyboard input" is performed can be selected by a selection button 1304 displayed on the first display portion 1303a. Since the selection buttons with a variety of sizes can be displayed, the portable information terminal can be easily used by people of any generation. In the case where "touch input" is selected, for example, a keyboard 1305 is displayed on the first display portion 1303a as illustrated in a right part of FIG. 11A. With the keyboard 1305, letters can be input quickly by keyboard input as in the case of using a conventional information terminal, for example.

Further, in the portable information terminal illustrated in FIG. 11A, either of the housing 1301 and the housing 1302 can be detached as illustrated in the right in FIG. 11A. The display portion 1303a can be a panel having a touch-input function, which contributes to further reduction in weight when it is carried around, and operation of screen data can be performed using the housing 1302 with the housing 1301 provided on a wall, which is very convenient.

The portable information terminal illustrated in FIG. 11A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 11A may transmit and receive data wirelessly. Through wireless communication, desired book data or the like can be purchased and downloaded from an electronic book server.

Further, the housing 1302 illustrated in FIG. 11A may be equipped with an antenna, a microphone function, or a wireless communication function to be used as a mobile phone.

Figure 11B:
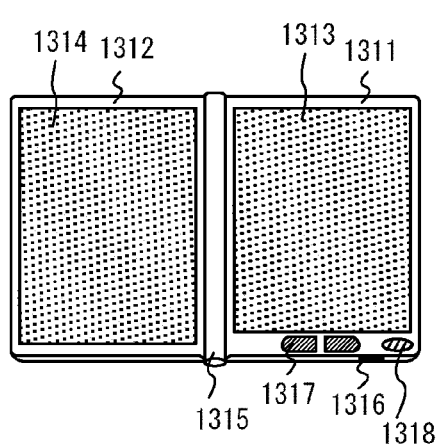

FIG. 11B illustrates an electronic book reader mounted with electronic paper. The electronic book reader has two housings of a housing 1311 and a housing 1312. The housing 1311 and the housing 1312 are provided with a display portion 1313 and a display portion 1314, respectively. The housings 1311 and 1312 are connected by a hinge portion 1315 and can be opened or closed with the hinge portion 1315. Further, the housing 1311 is provided with a power switch 1316, operation keys 1317, a speaker 1318, and the like. At least one of the housings 1311 and 1312 is provided with the semiconductor device described in any of the above embodiments. Therefore, an electronic book reader in which writing and reading of data are performed at high speed, data is retained for a long time, and power consumption is sufficiently reduced can be realized.

Figure 11C:
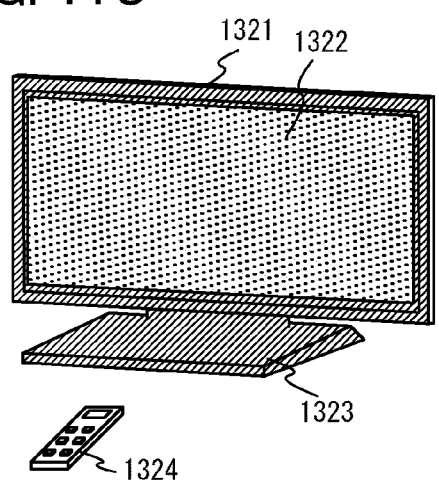

FIG. 11C is a television device including a housing 1321, a display portion 1322, a stand 1323, and the like. The television device 1320 can be operated by a switch of the housing 1321 or a remote controller 1324. The semiconductor device described in any of the above embodiments is mounted on the housing 1321 and the remote controller 1324. Therefore, a television device in which writing and reading of data are performed at high speed, data is retained for a long time, and power consumption is sufficiently reduced can be realized.

Figure 11D:
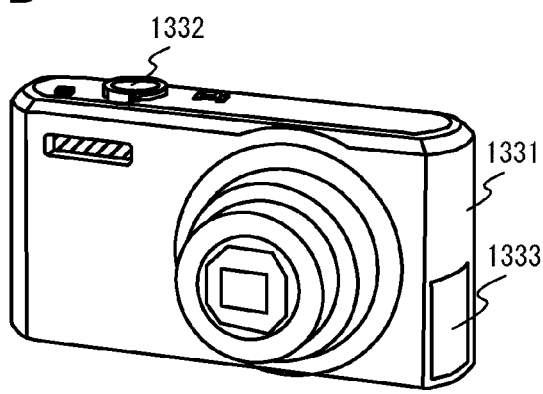

FIG. 11D illustrates a digital camera including a main body 1331, an operation switch 1332, a battery 1333, and the like. Further, the digital camera is provided with a display portion (not illustrated but positioned on the back surface of the main body) and the like on its back surface. The semiconductor device described in any of the above embodiments is provided in the main body 1331. Therefore, a digital camera in which writing and reading of data are performed at high speed, data is retained for a long time, and power consumption is sufficiently reduced can be realized.

As described above, the semiconductor device according to any of the above embodiments is mounted on each of the electronic appliances described in this embodiment. Accordingly, an electronic appliance in which power consumption is reduced can be realized.

This application is based on Japanese Patent Application serial no. 2011-103766 filed with Japan Patent Office on May 6, 2011, the entire contents of which are hereby incorporated by reference.

What is claimed is:

1. A semiconductor device comprising:
a source electrode and a drain electrode over an insulating surface;
an oxide semiconductor layer over the source electrode and the drain electrode;
a first electrode over one of the source electrode and the drain electrode with the oxide semiconductor layer interposed therebetween;
a gate insulating layer over and in contact with the oxide semiconductor layer and the first electrode; and
a gate electrode over the gate insulating layer so as to overlap with the first electrode.

2. The semiconductor device according to claim 1, wherein the first electrode is set to a constant potential or a ground potential.

3. The semiconductor device according to claim 1, wherein the oxide semiconductor layer contains one or more elements selected from In, Ga, Sn, and Zn.

4. A memory device including the semiconductor device according to claim 1.

5. The semiconductor device according to claim 1, further comprising an interlayer insulating layer over the gate electrode and the gate insulating layer,
wherein a contact hole is formed in the interlayer insulating layer so as to overlap with the first electrode.

6. The semiconductor device according to claim 5, wherein the first electrode is set to a constant potential or a ground potential.

7. The semiconductor device according to claim 5, wherein the oxide semiconductor layer contains one or more elements selected from In, Ga, Sn, and Zn.

8. A memory device including the semiconductor device according to claim 5.

9. The semiconductor device according to claim 1, further comprising an interlayer insulating layer over the gate electrode and the gate insulating layer,
wherein at least part of the gate electrode is exposed on a surface of the interlayer insulating layer, and
wherein the part of the gate electrode overlaps with the first electrode.

10. The semiconductor device according to claim 9, wherein the first electrode is set to a constant potential or a ground potential.

11. The semiconductor device according to claim 9, wherein the oxide semiconductor layer contains one or more elements selected from In, Ga, Sn, and Zn.

12. A memory device including the semiconductor device according to claim 9.

13. A semiconductor device comprising:
a gate electrode over an insulating surface;
a gate insulating layer adjacent to the gate electrode;
an oxide semiconductor layer adjacent to the gate electrode with the gate insulating layer interposed therebetween;
a source electrode and a drain electrode in contact with the oxide semiconductor layer;
a first electrode provided between the gate insulating layer and the oxide semiconductor layer,
wherein the first electrode overlaps with one of the source electrode and the drain electrode, and
wherein the first electrode overlaps with the gate electrode.

14. The semiconductor device according to claim 13, wherein the first electrode is set to a constant potential or a ground potential.

15. The semiconductor device according to claim 13, wherein the oxide semiconductor layer contains one or more elements selected from In, Ga, Sn, and Zn.

16. A memory device including the semiconductor device according to claim 13.

* * * * *